United States Patent [19]
Omata et al.

[11] Patent Number: 6,090,498
[45] Date of Patent: Jul. 18, 2000

[54] MAGNETORESISTANCE EFFECT ELEMENT AND MAGNETORESISTANCE DEVICE

[75] Inventors: Eiichi Omata, Saku; Satoru Araki, Chiba; Masashi Sano, Saku; Yasuyuki Yamamoto, Chiba, all of Japan

[73] Assignee: TDK Corporation, Tokyo, Japan

[21] Appl. No.: 08/950,798

[22] Filed: Oct. 15, 1997

[30] Foreign Application Priority Data

Dec. 27, 1996 [JP] Japan ................................. 8-357608

[51] Int. Cl.⁷ ........................................................ G11B 5/66
[52] U.S. Cl. ................ 428/692; 428/694 R; 428/694 T; 428/694 TS; 428/694 TM; 428/900; 360/113; 324/252
[58] Field of Search ............................ 428/694 R, 694 T, 428/694 TS, 694 TM, 692, 900; 360/113; 324/252

[56] References Cited

U.S. PATENT DOCUMENTS

| | | | |
|---|---|---|---|
| 4,103,315 | 7/1978 | Hempstead et al. | 360/110 |
| 4,755,897 | 7/1988 | Howard | 360/113 |
| 5,549,978 | 8/1996 | Iwasaki | 428/692 |

FOREIGN PATENT DOCUMENTS

| | | |
|---|---|---|
| 60-32330 | 7/1985 | Japan. |
| 60-35813 | 8/1985 | Japan. |
| 4-358310 | 12/1992 | Japan. |
| 6-36443 | 5/1994 | Japan. |

OTHER PUBLICATIONS

E. Dieny, et al., Physical Review B, vol. 63, No. 1, pp. 1297–1300, Jan. 1, 1991, "Giant Magnetoresistance in Soft Ferromagnetic Multilayers".

Ching Tsang, et al., IEEE Transactions on Magnetics, vol. 30, No. 6, pp. 3801–3806, Nov. 1994, "Design, Fabrication & Testing of Spin-Valve Read Heads for High Density Recording".

*Primary Examiner*—Leszek Kiliman
*Attorney, Agent, or Firm*—Oblon, Spivak, McClelland, Maier & Neustadt, P.C.

[57] ABSTRACT

In a magnetoresistance effect element, a pinning layer (antiferromagnetic layer) has a composition of Ru—Mn or Ru—M—Mn where M represents at least one selected from Rh, Pt, Pd, Au, Ag, and Re, and impurity concentrations of the pinning layer are regulated. Accordingly, there can be provided the magnetoresistance effect element having a magnetic multilayered film which is excellent in corrosion resistance, thermal stability and magnetic field sensitivity and has a large MR change ratio, as well as a magnetoresistance device, such as a magnetoresistance effect type head or the like, using such a magnetoresistance effect element.

46 Claims, 18 Drawing Sheets

DISTRIBUTION DIAGRAM OF Hua

DISTRIBUTION DIAGRAM OF Tb

MAGNETORESISTANCE EFFECT ELEMENT AND MAGNETORESISTANCE DEVICE

BACKGROUND OF THE INVENTION

1. Field of the Invention

The present invention relates to a magnetoresistance effect element for reading the magnetic field intensity of a magnetic recording medium or the like as a signal and, in particular, to a magnetoresistance effect element which is capable of reading a small magnetic field change as a greater electrical resistance change signal, and further relates to a magnetoresistance device, such as a magnetoresistance effect type head, using such a magnetoresistance effect element.

2. Description of the Prior Art

Following the recent increase in density of magnetic recording, induction type magnetic heads are being replaced by magnetoresistance effect type heads (hereinafter referred to as "MR heads") in the field of read-only heads. The MR head utilizes a magnetoresistance effect and senses a change in magnetic flux from a recording medium, that is, a signal magnetic field, based on a change in resistance. An output voltage is given by the product of a change in resistance of a magnetoresistance effect element (hereinafter referred to as "MR element") sensing a change in magnetic flux and a sense current flowing in the MR element. Accordingly, the output voltage can be set large, and further, a value of the output voltage can be freely changed by a value of the sense current. Thus, as different from the induction type magnetic head, the output voltage does not depend a relative speed between a head sensor portion and the recording medium.

In the MR head, the MR element which senses the change in magnetic flux from the recording medium to change its resistance is made of an NiFe alloy. The NiFe alloy is excellent in anisotropy magnetoresistance effect (hereinafter referred to as "AMR") and, since it is a soft magnetic material, its response is excellent in a small magnetic field.

However, for the NiFe alloy to perform the optimum operation as an MR element, two biases are required. Specifically, as the first bias, a lateral bias is required which is applied to a surface of the magnetic recording medium in perpendicular thereto and to a surface of the MR element in parallel thereto for achieving the linearity of a magnetic field response of the MR element. The lateral bias is generated by the flow of sense current in a soft film bias layer (made of, for example, NiFeRh or NiFeCr) adhered to an NiFe alloy layer via a magnetic separation layer (made of, for example, Ta).

As the second bias, a longitudinal bias is required for suppressing Barkhausen jump noise (hereinafter referred to as "BHN") which is caused upon movement of domain walls of multidomains in the MR element in response to the magnetic field. The longitudinal bias is given by an exchange coupling magnetic field (hereinafter referred to as "Hua") caused by a laminate film of the NiFe alloy and an antiferromagnetic material (for example, FeMn) as the MR element. The Hua is a magnetic field generated by an exchange interaction at a contact surface between the ferromagnetic material and the antiferromagnetic material.

By this exchange coupling, the longitudinal bias is applied to the NiFe alloy being the MR element. As a result, a domain structure of the NiFe alloy approximates a single domain to control BHN.

In the MR using the AMR, since the MR element is the NiFe alloy, a magnetoresistance change ratio (hereinafter referred to as "MR change ratio") is about 2 to 3%. Therefore, recently, as a film replacing NiFe, attention has been paid to artificial lattices and spin valve films (for example, PHYSICAL REVIEW B volume 43, page 1297, in 1991, and Japanese First (unexamined) Patent Publication No. 4-358310) revealing a giant magnetoresistance effect (hereinafter referred to as "GMR"). Among the films revealing the GMR, since the spin valve film is simple in structure and small in operation magnetic field as compared with the artificial lattice, attention has been further paid thereto. An example of actual review of the spin valve film for use in the magnetoresistance effect element of the magnetoresistance effect type reproduction head is reported in IEEE TRANSACTION ON MAGNETICS volume 30, page 3801, in 1994. The reported spin valve film is a magnetic multilayered film which is formed by coupling a soft magnetic layer (also called a free layer and made of NiFe or the like) responsive to a magnetic field, and a fixed layer in the form of a two-layer film of a ferromagnetic layer (NiFe, CoFe, CoFeNi or the like) and an antiferromagnetic layer (FeMn), via a non-magnetic material (Cu, Au, Ag or the like) interposed therebetween. The spin valve film shows a very high MR change ratio of 3 to 10% as compared with the NiFe alloy. According to the GMR of the spin valve film, the resistance thereof becomes minimum when magnetization (Mf) of the soft magnetic layer which can freely respond to the magnetic field and magnetization (Mp) of the fixed layer (two-layer film whose magnetization direction is fixed due to Hua generated at a contact surface between the ferromagnetic layer and the antiferromagnetic layer) are parallel to each other. It is assumed that the resistance at this time is $R_0$. On the other hand, when Mf and Mp are antiparallel to each other, the resistance of the spin valve film becomes maximum. It is assumed that the resistance at this time is $R_m$. The GMR change ratio is given by $(R_m - R_0)/R_0$.

When the directions of magnetization of those layers are parallel to each other, the current flowing in the spin valve film is not subjected to scattering of electrons due to spins at the interface between the non-magnetic layer and the soft magnetic layer and at the interface between the non-magnetic layer and the fixed layer so that the resistance becomes minimum.

On the other hand, when the magnetization directions are antiparallel to each other, the current flowing in the spin valve film is subjected to scattering of electrons due to spins at the interface between the non-magnetic layer and the soft magnetic layer and at the interface between the non-magnetic layer and the fixed layer so that the resistance becomes maximum.

In the MR head using the AMR and the spin valve head (MR head) using the GMR, a so-called pinning operation is required which generates Hua by stacking and joining the ferromagnetic film and the antiferromagnetic film. In the MR head using the AMR, the pinning is carried out for generating a longitudinal bias magnetic field to control the BHN. In the spin valve head, the pinning is carried out for fixing the magnetization.

As materials for the antiferromagnetic films which generate Hua, γ-FeMn alloy (for example, U.S. Pat. No. 4,103, 315), NiO, α-$Fe_2O_3$ and Mn gamma alloy containing an element selected from Fe, Co, Cu, Ge, Ni, Pt and Rh (Japanese Second (examined) Patent Publication No. 60-32330) have been known. Further, U.S. Pat. No. 4,755, 897 has proposed FeMn added with Cr.

However, the foregoing materials of the antiferromagnetic films are not sufficient in corrosion resistance or thermal stability, resulting in deterioration of Hua due to corrosion or deterioration of Hua due to temperature change. In addition to the foregoing problem, a high blocking temperature (at which Hua becomes zero) is required in the spin valve film. Further, during a fabricating process, it is required that the blocking temperature is within a certain range for performing an orthogonalization heat treatment and that the blocking temperature can be selected to some extent.

SUMMARY OF THE INVENTION

Therefore, it is an object of the present invention to provide an antiferromagnetic layer (pinning layer) which is excellent in corrosion resistance and thermal stability, free from deterioration of Hua and sufficiently high in blocking temperature, and a magnetoresistance effect element having a magnetic multilayered film which, utilizing the characteristics of the antiferromagnetic layer (pinning layer), is excellent in corrosion resistance and thermal stability, high in magnetic field sensitivity and large in MR change ratio, and further provide a magnetoresistance device, such as a magnetoresistance effect type head, using such a magnetoresistance effect element.

According to one aspect of the present invention, a magnetoresistance device comprises a magnetoresistance effect element, conductive films and electrode portions, wherein the conductive films are conductively connected to the magnetoresistance effect element through the electrode portions, and the magnetoresistance effect element comprises a magnetic multilayered film including a non-magnetic metal layer, a ferromagnetic layer formed on one surface of the non-magnetic metal layer, a soft magnetic layer formed on the other surface of the non-magnetic metal layer, and a pinning layer which is formed on a surface of the ferromagnetic layer remote from a surface thereof abutting the non-magnetic metal layer so as to pin a direction of magnetization of the ferromagnetic layer, and wherein the pinning layer is made of $Ru_xM_yMn_z$ where M represents at least one selected from Rh, Pt, Pd, Au, Ag and Re, $1 \leq x \leq 30$, $1 \leq y \leq 30$, $69 \leq z \leq 90$, $10 \leq x+y \leq 31$, and the unit of x, y and z is atomic %.

According to another aspect of the present invention, a magnetoresistance device comprises a magnetoresistance effect element, conductive films and electrode portions, wherein the conductive films are conductively connected to the magnetoresistance effect element through the electrode portions, and the magnetoresistance effect element comprises a magnetic multilayered film including a non-magnetic metal layer, a ferromagnetic layer formed on one surface of the non-magnetic metal layer, a soft magnetic layer formed on the other surface of the non-magnetic metal layer, and a pinning layer which is formed on a surface of the ferromagnetic layer remote from a surface thereof abutting the non-magnetic metal layer so as to pin a direction of magnetization of the ferromagnetic layer, and wherein the pinning layer is made of $Ru_xM_yMn_z$ where M represents at least one selected from Rh, Pt, Pd, Au, Ag and Re, $1 \leq x \leq 59$, $1 \leq y \leq 59$, $40 \leq z \leq 58$, $42 \leq x+y \leq 60$, and the unit of x, y and z is atomic %.

According to another aspect of the present invention, a magnetoresistance device comprises a magnetoresistance effect element, conductive films and electrode portions, wherein the conductive films are conductively connected to the magnetoresistance effect element through the electrode portions, and the magnetoresistance effect element comprises a magnetic multilayered film including a non-magnetic metal layer, a ferromagnetic layer formed on one surface of the non-magnetic metal layer, a soft magnetic layer formed on the other surface of the non-magnetic metal layer, and a pinning layer which is formed on a surface of the ferromagnetic layer remote from a surface thereof abutting the non-magnetic metal layer so as to pin a direction of magnetization of the ferromagnetic layer, and wherein the pinning layer is made of $Ru_xMn_{100-x}$ where $15 \leq x \leq 30$, and the unit of x is atomic %.

According to another aspect of the present invention, a magnetoresistance effect element comprises a magnetic multilayered film including a non-magnetic metal layer, a ferromagnetic layer formed on one surface of the non-magnetic metal layer, a soft magnetic layer formed on the other surface of the non-magnetic metal layer, and a pinning layer which is formed on a surface of the ferromagnetic layer remote from a surface thereof abutting the non-magnetic metal layer so as to pin a direction of magnetization of the ferromagnetic layer, wherein the pinning layer is made of $Ru_xM_yMn_z$ where M represents at least one selected from Rh, Pt, Pd, Au, Ag and Re, $1 \leq x \leq 30$, $1 \leq y \leq 30$, $69 \leq z \leq 90$, $10 \leq x+y \leq 31$, and the unit of x, y and z is atomic %.

According to another aspect of the present invention, a magnetoresistance effect element comprises a magnetic multilayered film including a non-magnetic metal layer, a ferromagnetic layer formed on one surface of the non-magnetic metal layer, a soft magnetic layer formed on the other surface of the non-magnetic metal layer, and a pinning layer which is formed on a surface of the ferromagnetic layer remote from a surface thereof abutting the non-magnetic metal layer so as to pin a direction of magnetization of the ferromagnetic layer, wherein the pinning layer is made of $Ru_xM_yMn_z$ where M represents at least one selected from Rh, Pt, Pd, Au, Ag and Re, $1 \leq x \leq 59$, $1 \leq y \leq 59$, $40 \leq z \leq 58$, $42 \leq x+y \leq 60$, and the unit of x, y and z is atomic %.

According to another aspect of the present invention, a magnetoresistance effect element comprises a magnetic multilayered film including a non-magnetic metal layer, a ferromagnetic layer formed on one surface of the non-magnetic metal layer, a soft magnetic layer formed on the other surface of the non-magnetic metal layer, and a pinning layer which is formed on a surface of the ferromagnetic layer remote from a surface thereof abutting the non-magnetic metal layer so as to pin a direction of magnetization of the ferromagnetic layer, wherein the pinning layer is made of $Ru_xMn_{100-x}$ where $15 \leq x \leq 30$, and the unit of x is atomic %.

It may be arranged that the pinning layer has an oxygen concentration of no more than 5,000 atomic ppm, a carbon concentration of no more than 5,000 atomic ppm, a sulfur concentration of no more than 5,000 atomic ppm, and a chlorine concentration of no more than 5,000 atomic ppm. With this arrangement, since the pinning layer (antiferromagnetic layer) has a composition of Ru—Mn or Ru—M—Mn where M represents at least one selected from Rh, Pt, Pd, Au, Ag and Re, and the impurity concentrations of the pinning layer are regulated, there can be provided the magnetoresistance effect element having the magnetic multilayered film which is excellent in corrosion resistance, thermal stability and magnetic field sensitivity and has a large MR change ratio, as well as the magnetoresistance device, such as a magnetoresistance effect type head or the like, using such a magnetoresistance effect element.

DETAILED DESCRIPTION OF THE INVENTION

Hereinbelow, the concrete structures of the present invention will be described in detail.

Figure 1:
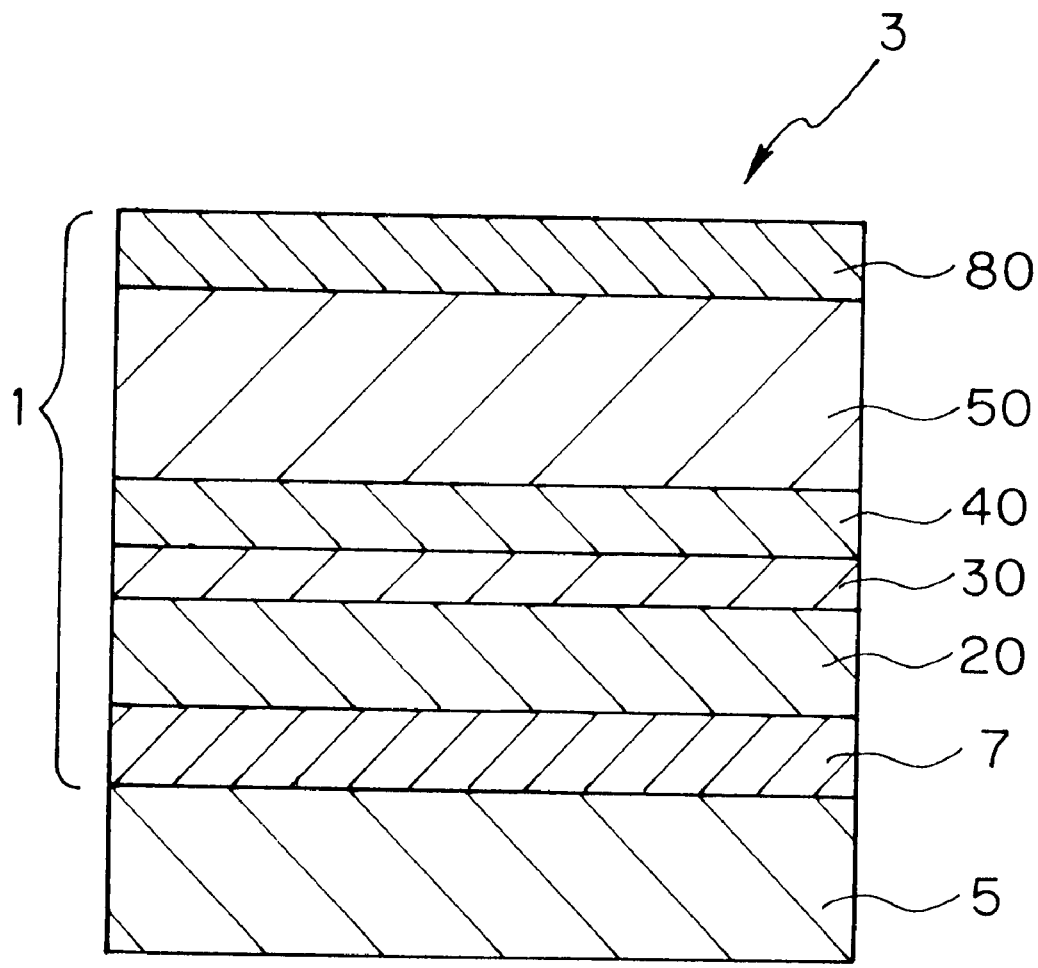
FIG. 1 is a sectional view showing a magnetoresistance effect element according to the present invention.

FIG. 1 is a sectional view showing a magnetoresistance effect element 3 according to a preferred embodiment of the present invention. The magnetoresistance effect element 3 has a magnetic multilayered film as a spin valve film showing a giant magnetoresistance effect (GMR) (hereinafter simply referred to as the magnetic multilayered film 1). As shown in FIG. 1, the magnetic multilayered film 1 has a laminate body structure which comprises a non-magnetic metal layer 30, a ferromagnetic layer 40 formed on one surface of the non-magnetic metal layer 30, a soft magnetic layer 20 formed on the other surface of the non-magnetic metal layer 30, and a pinning layer 50 which is formed on a surface of the ferromagnetic layer 40 remote from the other surface thereof abutting the non-magnetic metal layer 30 so as to pin the direction of magnetization of the ferromagnetic layer 40.

As shown in FIG. 1, the laminate body is normally formed on a substrate 5, and they are laminated from the side of the substrate 5 via a ground layer 7 in the order of the soft magnetic layer 20, the non-magnetic metal layer 30, the ferromagnetic layer 40 and the pinning layer 50. As shown in the drawing, a protective layer 80 is formed on the pinning layer 50 for preventing oxidation.

In the magnetic multilayered film 1 (spin valve film) according to this embodiment, it is required that the soft magnetic layer 20 and the ferromagnetic layer 40 which are adjacently formed at both sides of the non-magnetic metal layer 30 have substantially different magnetization directions from each other in accordance with a signal magnetic field applied from the external. The reason is as follows: In the principle of the present invention, when the magnetization directions of the soft magnetic layer 20 and the ferromagnetic layer 40 which are formed via the non-magnetic metal layer 30 interposed therebetween are deviated from each other, conduction electrons have a behavior of scattering due to spins to increase its resistance. In this case, when the magnetization directions are opposite to each other, the maximum resistance is obtained. That is, in this invention, when a signal magnetic field from the external is positive (in an upward direction with respect to a recording surface 93 of a recording medium 90 (represented by reference numeral 92)) as shown in FIG. 2, there occur mutually opposite components in the magnetization directions of the neighboring magnetic layers so that the resistance is increased.

Here, the relationship among the external signal magnetic field from the magnetic recording medium, the magnetization directions of the soft magnetic layer 20 and the ferromagnetic layer 40 and the variation of electrical resistance in the (spin valve) magnetic multilayered film used in the magnetoresistance effect element of the present invention will be described.

Now, in order to facilitate the understanding of the present invention, the simplest magnetic multilayered film in which the pair of soft magnetic layer 20 and ferromagnetic layer 40 exist via the non-magnetic metal layer 30 as shown in FIG. 1 will be described with reference to FIG. 2.

Figure 2:
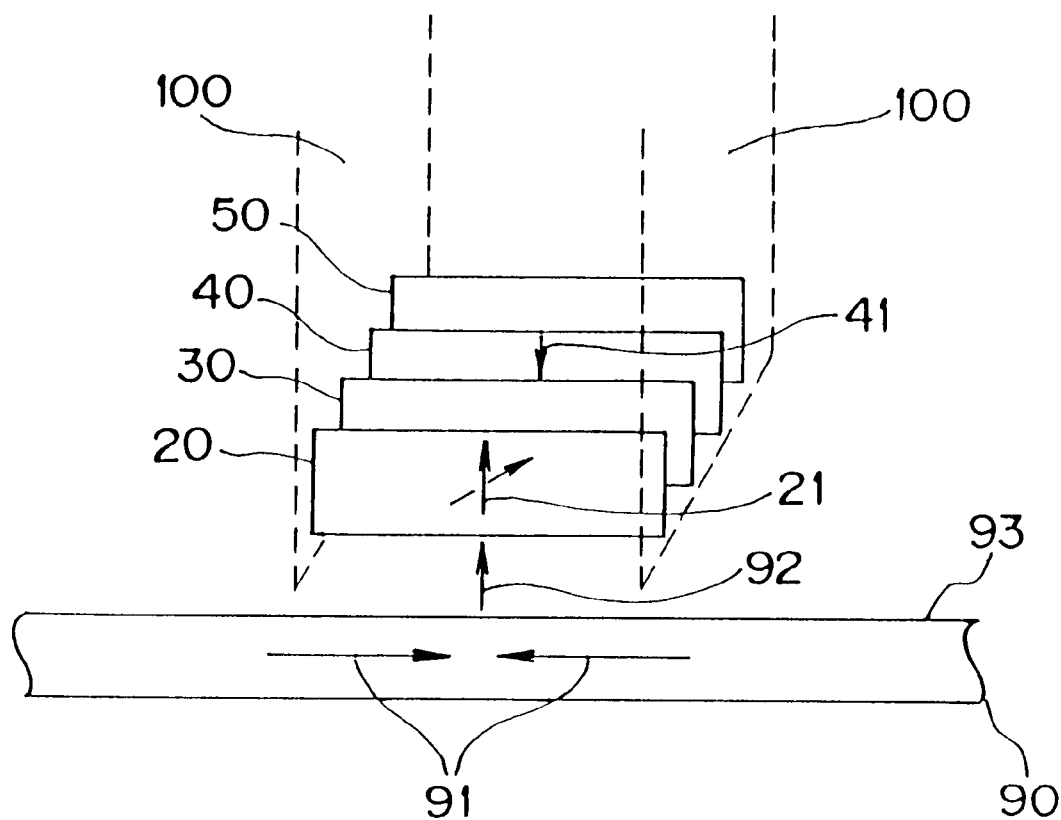
FIG. 2 is a schematic diagram showing a magnetoresistance effect element, particularly, a structure of a magnetic multilayered film, for explaining an operation of the present invention.

As shown in FIG. 2, the magnetization of the ferromagnetic layer 40 is pinned in a downward direction to the surface of the recording medium by a method as described later (see reference numeral 41). The soft magnetic layer 20 is formed via the non-magnetic metal layer 30 so that the magnetization direction thereof is varied in accordance with the signal magnetic field from the external (see reference numeral 21). At this time, the relative angle between the magnetization directions of the soft magnetic layer 20 and the ferromagnetic layer 40 is greatly varied in accordance with the direction of the signal magnetic field from the magnetic recording medium 90. As a result, the scattering degree of the conduction electrons flowing in the magnetic layers is varied, and thus the electrical resistance is greatly varied.

Accordingly, a large MR (Magneto-Resistive) effect, which essentially differs in mechanism from the anisotropic magnetoresistance effect of Permalloy, can be obtained.

Figure 3:
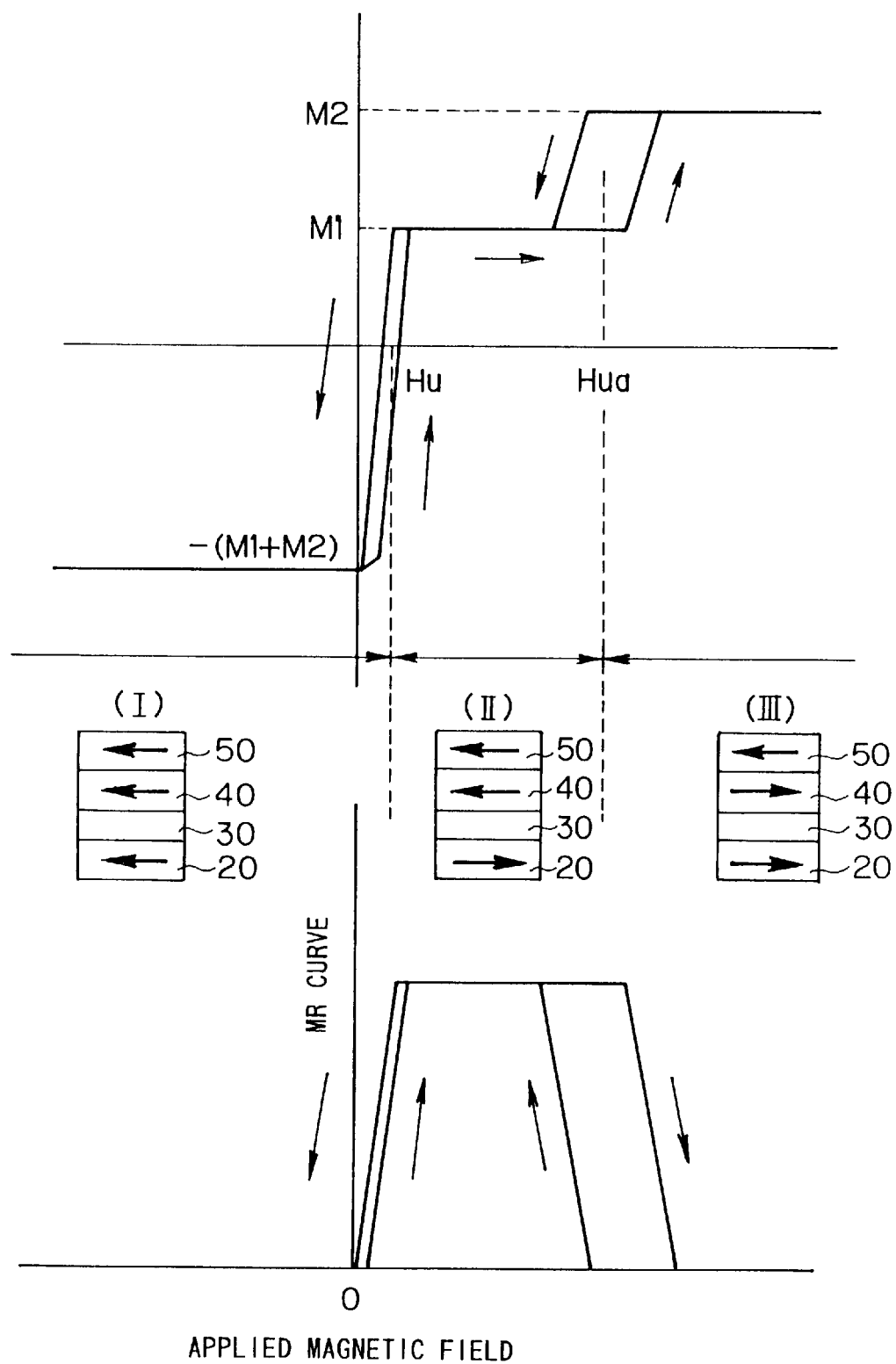
FIG. 3 is a schematic diagram showing a magnetization curve and an MR curve for explaining an operation of the present invention.

The magnetization directions of the soft magnetic layer 20, the ferromagnetic layer 40 and the pinning layer 50 exhibiting a pinning effect are varied relative to the external magnetic field. The variation of the magnetization directions thereof is shown in FIG. 3 in correspondence with the magnetization curve and the MR curve. In this case, all the magnetization of the ferromagnetic layer 40 is fixed in a minus direction (in a downward direction with respect to the recording surface of the recording medium 90). When the external signal magnetic field is minus, the magnetization of the soft magnetic layer 20 is in the minus direction. Now, it is assumed that the coercive force of each of the soft magnetic layer 20 and the ferromagnetic layer 40 is approximate to zero in order to simplify the description. In an area (I) where the signal magnetic field H<0, the magnetization of both the soft magnetic layer 20 and the ferromagnetic layer 40 is oriented in one direction.

When the external magnetic field is intensified and H exceeds the coercive force of the soft magnetic layer 20, the magnetization direction of the soft magnetic layer is rotated in the direction of the signal magnetic field, so that the magnetization and the electrical resistance are increased as the magnetization directions of the soft magnetic layer 20 and the ferromagnetic layer 40 become antiparallel to each other. Finally, these values are fixed (state of an area (II)). At this time, a pinning magnetic field Hua is applied by the pinning layer 50. If the signal magnetic field exceeds Hua, the magnetization of the ferromagnetic layer 40 is also rotated in the direction of the signal magnetic field, so that the magnetization of each of the soft magnetic layer 20 and the ferromagnetic layer 40 is oriented in the same direction in an area (III). At this time, the magnetization is set to a constant value, and the MR curve is equal to zero.

Conversely, when the signal magnetic field H is reduced, the magnetization is changed from the area (III) through the area (II) to the area (I) by inversion of the magnetization of the soft magnetic layer 20 and the ferromagnetic layer 40 in the same manner as described above. At an initial portion of the area (II), conduction electrons have a behavior of scattering dependent on spins, and the resistance is increased. In the area (II), the ferromagnetic layer 40 has little magnetization inversion because it is pinned, while the magnetization of the soft magnetic layer 20 increases linearly, so that the rate of spin-dependent scattered conduction electrons is gradually increased in accordance with the magnetization change of the soft magnetic layer 20. That is, if $Ni_{0.8}Fe_{0.2}$ whose Hc is low is selected for the soft magnetic layer 20 and a suitable anisotropic magnetic field Hk is applied, a formed magnetic multilayered film has a linearly-varying resistance and a large magnetoresistance ratio in a small external magnetic field of several 0 e to several tens 0 e below Hk.

In the present invention, the thickness of each of the thin film layers has its own preferred range. It is preferable that a thickness of the non-magnetic metal layer is in the range from 15 to 40 Å If the thickness of the non-magnetic metal layer is greater than 40 Å the rate of the conduction electrons flowing through only this layer increases, so that the total MR change becomes small unfavorably. If the thickness becomes thinner than 15 Å the ferromagnetic magnetic-coupling between the soft magnetic layer 20 and the ferromagnetic layer 40 is so increased that the antiparallel state of the spins for achieving the large MR effect can not be obtained. On the other hand, the conduction electrons are scattered at the interface portion between the non-magnetic metal layer and each of the soft magnetic layer 20 and the ferromagnetic layer 40, so that the effect is not substantially improved even if the thickness of the two magnetic layers 20 and 40 is larger than 200 Å. Rather, it is unfavorable because the total film thickness is increased. The thickness of the two magnetic layers 20 and 40 is preferably set to 16 Å or more. If the thickness is smaller than this value, the heat resistance and the resistance against processing are deteriorated.

Hereinbelow, each constitution of the foregoing magnetoresistance effect element 3 will be described in detail. The first feature of this magnetoresistance effect element resides in composition of the pinning layer 50.

The pinning layer 50 of the present invention has a composition represented by $Ru_xM_yMn_z$ (M represents at least one kind selected from Rh, Pt, Pd, Au, Ag and Re) or $Ru_xMn_{100-x}$.

First, the pinning layer 50 having the composition of $Ru_xM_yMn_z$ will be explained.

In this composition, as noted above, M is at least one kind of element selected from Rh, Pt, Pd, Au, Ag and Re. When only one kind is selected for M, the ternary composition is obtained. When two or more kinds are selected for M, the four-element or more-element composition is obtained. Although the effect of the present invention can be achieved in the foregoing all range of M, the ternary composition selecting Rh or Pt for M is most preferable.

In $Ru_xM_yMn_z$, x, y and z represent ratios of the respective elements and the unit is atomic %. In $Ru_xM_yMn_z$ of the present invention, the following two preferred composition ranges exist when roughly classified:

$1 \leq x \leq 30, 1 \leq y \leq 30, 69 \leq z \leq 90, 10 \leq x+y \leq 31$      (1)

$1 \leq x \leq 59, 1 \leq y \leq 59, 40 \leq z \leq 58, 42 \leq x+y \leq 60$      (2)

In the composition range (I) where $1 \leq x \leq 30$, $1 \leq y \leq 30$, $69 \leq z \leq 90$ and $10 \leq x+y \leq 31$, preferably $1 \leq x \leq 24$, $1 \leq y \leq 24$, $75 \leq z \leq 85$ and $15 \leq x+y \leq 25$, and more preferably $1 \leq x \leq 22$, $1 \leq y \leq 22$, $77 \leq z \leq 82$ and $18 \leq x+y \leq 23$. In the composition range (1), if a value of z becomes less than 69 atomic % and a value of x+y exceeds 31 atomic %, a value of the exchange coupling magnetic field Hua and a blocking temperature Tb (defined as a temperature at which a value of Hua becomes 0) are both lowered. On the other hand, if a value of z exceeds 90 atomic % and a value of x+y becomes less than 10 atomic %, a value of the exchange coupling magnetic field Hua and a blocking temperature Tb are both reduced similar to the above, and further, the corrosion resistance is lowered following the increase of Mn. In the composition range (1), it is considered that an irregular alloy of M and Mn is formed and thereby the whole pinning layer 50 reveals the antiferromagnetism so that the excellent exchange coupling magnetic field Hua is obtained. Further, by adjusting the composition in the range of $10 \leq x+y \leq 31$, the blocking temperature Tb can be desirably set within the range of, for example, 160° C. to 250° C. With the foregoing arrangement, orthogonalization of magnetization necessary for the spin valve film (orthogonalization between magnetization of the soft magnetic layer 20 and magnetization of the ferromagnetic layer 40 when the external magnetic field is 0) can be smoothly achieved.

In the composition range (2) where $1 \leq x \leq 59$, $1 \leq y \leq 59$, $40 \leq z \leq 58$ and $42 \leq x+y \leq 60$, preferably $1 \leq x \leq 57$, $1 \leq y \leq 57$, $42 \leq z \leq 57$ and $43 \leq x+y \leq 58$, more preferably $1 \leq x \leq 54$, $1 \leq y \leq 54$, $45 \leq z \leq 55$ and $45 \leq x+y \leq 55$, and further preferably $1 \leq x \leq 54$, $1 \leq y \leq 54$, $45 \leq z \leq 54$ and $46 \leq x+y \leq 55$. In the composition range (2), the quite excellent exchange coupling magnetic field Hua, blocking temperature Tb and corrosion resistance are obtained. If a value of z becomes less than 40 atomic % and a value of x+y exceeds 60 atomic %, a value of the exchange coupling magnetic field Hua is rapidly reduced. On the other hand, if a value of z exceeds 58 atomic % and a value of x+y becomes less than 42 atomic %, a value of the exchange coupling magnetic field Hua is rapidly reduced similar to the above. In the composition range (2) where $1 \leq x \leq 59$, $1 \leq y \leq 59$, $40 \leq z \leq 58$ and $42 \leq x+y \leq 60$, it is considered that a regular alloy of Mn and another element in the ratio of about 1:1 is formed and thereby the quite excellent exchange coupling magnetic field Hua and blocking temperature Tb are achieved. Further, since the amount of Mn is small, the corrosion resistance is also quite excellent. Moreover, by adjusting the composition in the range of $42 \leq x+y \leq 60$, the blocking temperature Tb can be desirably set within the range of, for example, 160° C. to 400° C. With the foregoing arrangement, orthogonalization of magnetization necessary for the spin valve film (orthogonalization between magnetization of the soft magnetic layer 20 and magnetization of the ferromagnetic layer 40 when the external magnetic field is 0) can be smoothly achieved.

Now, the pinning layer 50 having the composition of $Ru_xMn_{100-x}$ will be explained. In this two-element pinning layer 50, the range of x (unit of x is atomic %) is set to preferably $15 \leq x \leq 30$, more preferably $18 \leq x \leq 27$, and further preferably $20 \leq x \leq 25$. If a value of x becomes less than 15 atomic % or exceeds 30 atomic %, the exchange coupling magnetic field Hua is reduced unfavorably. If the foregoing M is added to the Ru—Mn composition, the exchange coupling magnetic field Hua and the blocking temperature Tb are further improved as described above.

The blocking temperature Tb of the foregoing pinning layer 50 is 160° C. or higher, particularly 160° C. to 400° C., so that the pinning layer 50 reveals the very high thermal stability. In case of FeMn which has been conventionally used, the blocking temperature is about 150° C.

In this embodiment, the exchange coupling energy Jk between the pinning layer 50 and the ferromagnetic layer 40 reveals a very high value of no less than 0.06 erg/cm$^2$, particularly 0.08 to 0.18 erg/cm$^2$. The exchange coupling energy Jk represents a strength of fixing (pinning) magnetization of the ferromagnetic layer 40 and is derived by (ferromagnetic layer saturation magnetization)×(Hua)×(thickness).

Further, in a relationship of temperature-exchange coupling energy between the pinning layer 50 and the ferromagnetic layer 40, it is preferable in view of the temperature stability that a temperature coefficient Tc in the range of 80 to 130° C. falls within the range of $-2 \times 10^{-4}$ to $-8 \times 10^{-4}$ erg/cm$^2$. The temperature coefficient Tc is defined as follows. Specifically, in a graph showing a relationship of temperature T-exchange coupling energy Jk, differential values $d(Jk)/d(T)$ are derived at two points of 80° C. and 130° C. in the range of 80 to 130° C., and then the derived values at the two points are arithmetically averaged. The averaged value is defined as a value of the temperature coefficient Tc.

Further, it is preferable that, in the pinning layer 50, the oxygen concentration is no more than 5,000 atomic ppm, preferably no more than 3,000 atomic ppm, the carbon concentration is no more than 5,000 atomic ppm, preferably no more than 3,000 atomic ppm, the sulfur concentration is no more than 5,000 atomic ppm, preferably no more than 3,000 atomic ppm, and the chlorine concentration is no more than 5,000 atomic ppm, preferably no more than 3,000 atomic ppm. When the oxygen concentration increases, Mn contained in the pinning layer 50 is oxidized so that the characteristics (for example, Hua, Tb, Jk) as an antiferromagnetic layer are deteriorated. Further, the magnetic characteristic of the ferromagnetic layer 40 abutting the pinning layer 50 is also deteriorated, and the thermal resistance is also adversely affected. Similarly, if the concentration of carbon, sulfur or chlorine in the pinning layer 50 exceeds the foregoing value, the characteristics as an antiferromagnetic layer are also deteriorated. In view of this, it is necessary to set the film forming condition so as not to exceed the foregoing impurity concentrations. The foregoing impurity concentrations have no lower limits and preferably approximate to zero as much as possible.

The thickness of the pinning layer 50 is set to 50 Å to 1,000 Å preferably 60 Å to 800 Å more preferably 10 Å to 500 Å still more preferably 70 Å to 300 Å. If the thickness of the pinning layer 50 becomes smaller than 50 Å, the exchange coupling magnetic field Hua and the blocking temperature Tb are rapidly reduced. On the other hand, in case of being thicker, it is not so serious. However, if it is too thick, a gap length (a shield-shield length) of the MR head is so increased that it is not suitable for the ultrahigh density magnetic recording. Thus, it is preferably less than 1,000 Å.

The pinning layer 50 is formed using a method, such as an ion beam sputtering method, a sputtering method, a reactive deposition method or a molecular beam epitaxy (MBE) method. There is no particular limitation to these film forming methods.

The ferromagnetic layer 40 is formed of a metal element such as Fe, Ni, Co, Mn, Cr, Dy, Er, Nd, Tb, Tm, Ce, Gd, alloy or compound containing the above metal element. Particularly, it is preferably formed of a composition expressed by $(Co_zNi_{1-z})_wFe_{1-w}$ ($0.4 \leq z \leq 1.0$, $0.5 \leq w \leq 1.0$ by weight). Out of the composition range as described above, no large electrical resistance change can be obtained.

The thickness of the ferromagnetic layer 40 as described above is set to 16 to 100 Å, and more preferably 20 to 60 Å. If this value is smaller than 16 Å, it loses the characteristic as the ferromagnetic layer. On the other hand, if the value exceeds 100 Å, the pinning force of the pinning layer 50 is reduced, and thus the sufficient pinning effect of the spin of the ferromagnetic layer can not be obtained.

As described above, since the ferromagnetic layer 40 is in direct abutment with the pinning layer 50, a direct interlayer interaction acts on each other, and the rotation of the magnetization of the ferromagnetic layer 40 is prevented. On the other hand, with respect to the soft magnetic layer 20 as described later in detail, its magnetization can be freely rotated by a signal magnetic field from outside. As a result, a relative angle is produced in magnetization between the soft magnetic layer 20 and the ferromagnetic layer 40, so that a large MR effect due to the difference between the magnetization directions can be obtained.

The soft magnetic layer 20 is formed of Fe, Ni, Co or the like revealing soft magnetic characteristics, or alloy or compound containing these elements. The MR curve rises up more sharply by using the magnetic layer having a small coercive force Hc, and a favorable effect can be obtained. It is particularly preferable that the soft magnetic layer 20 has the following two-layer structure. Specifically, the soft magnetic layer 20 is formed as a two-layer laminate body comprising, from the side of the non-magnetic layer 30, a first soft magnetic layer and a second soft magnetic layer. The first soft magnetic layer is made of a simple substance of Co (cobalt) or an alloy containing Co no less than 80 weight %. The second soft magnetic layer has a composition expressed by $(Ni_xFe_{1-x})_yCo_{1-y}$ ($0.7 \leq x \leq 0.9$, $0.5 \leq y \leq 0.8$ by weight). With this arrangement, the first soft magnetic layer with Co being rich works as a diffusion blocking layer so as to prevent diffusion of Ni from the side of the second soft magnetic layer toward the non-magnetic metal layer 30. Further, since the first soft magnetic layer with Co being rich enhances the scattering of electrons, the MR change ratio is improved. The second soft magnetic layer is formed within the foregoing composition range for maintaining the soft magnetic characteristic.

The thickness of the soft magnetic layer 20 as described above is set to 20 to 150 Å, preferably 30 to 120 Å, and more preferably 50 to 100 Å. If this value is smaller than 20 Å, no excellent characteristic as the soft magnetic layer can be obtained. On the other hand, if the value exceeds 150 Å, the total thickness of the multilayered film is large and the resistance of the whole magnetic multilayered film is increased, so that the MR effect is reduced. When the soft magnetic layer 20 is in the form of the foregoing two-layer laminate body, it is sufficient to set the thickness of the Co-rich first soft magnetic layer to be no less than 4 Å.

In order to conduct electrons efficiently, a metal having conductivity is preferably used for the non-magnetic metal layer which is interposed between the soft magnetic layer 20 and the ferromagnetic layer 40. More specifically, it may be formed of at least one kind selected from Au, Ag and Cu, alloy containing 60 weight % or more of at least one of these elements, or the like.

The thickness of the non-magnetic metal layer 30 is preferably set to 15 to 40 Å. If this value is smaller than 15 Å, the soft magnetic layer 20 and the ferromagnetic layer 40 which are disposed through the non-magnetic metal layer are exchange-coupled to each other, so that the spins of the soft magnetic layer 20 and the ferromagnetic layer 40 do not function independently of each other. If this value exceeds 40 Å, the rate of the electrons which are scattered at the interface between the soft magnetic layer 20 and the ferromagnetic layer 40 disposed at the upper and lower sides respectively are reduced, so that the MR change ratio is reduced.

The protection layer 80 is provided to prevent oxidation of the surface of the magnetic multilayered film in a film-forming process and improve wettability with electrode material formed thereon and adhesive strength. The protection layer 80 is formed of Ti, Ta, W, Cr, Hf, Zr, Zn or the like. The thickness thereof is generally set to about 30 to 300 Å.

The substrate 5 is formed of glass, silicon, MgO, GaAs, ferrite, AlTiC, $CaTiO_3$ or the like, and the thickness thereof is generally set to about 0.5 to 10 mm.

The material of each layer and the thickness thereof are specified as described above, and an external magnetic field is applied in a direction within the film surface as described later at the film formation time of at least the soft magnetic layer 20 to apply anisotropic magnetic field Hk of 2 to 200 e, preferably 2 to 160 e, and more preferably 2 to 100 e.

If the anisotropic magnetic field Hk of the soft magnetic layer is lower than 20 e, it is equal to the same degree of the coercive force, and no linear MR change curve can be substantially obtained in the vicinity of zero magnetic field, so that the characteristic as the MR element is deteriorated. On the other hand, if it is higher than 200 e, when this film is applied to the MR head or the like, the output is liable to be reduced and the resolution is reduced. The value Hk as described above can be obtained by applying the external magnetic field of 10 to 3000 e at the film formation. If the external magnetic field is no greater than 100 e, it is too insufficient to induce Hk. On the other hand, if it exceeds 3000 e, the effect is not improved although a coil must be designed in large size due to an occurrence of magnetic field. Therefore, the cost is increased and thus it is inefficient.

The magnetic multilayered film 1 may be repetitively laminated to form a magnetoresistance effect element. In this case, the repetitive lamination frequency n of the magnetic multilayered film is not limited to a specific value, and it may be suitably selected in accordance with a desired magnetoresistance ratio, etc. In order to satisfy the present requirement for ultrahigh densification of the magnetic recording, the smaller total film thickness of the magnetic multilayered film is better. However, if the film is thinner, the MR effect is usually reduced. The magnetic multilayered film of this invention can be used in practice to a sufficient level, even when the repetitive lamination frequency n is 1. Furthermore, as the lamination frequency is increased, the magnetoresistance ratio increases while productivity is lowered. If n is excessively large, the resistance of the whole element is excessively low, and it is practically inconvenient. Therefore, usually, n is preferably set to 10 or less. The preferable range of n is 1 to 5.

The film formation of each layer of the foregoing magnetic multilayered film 1 may be performed by an ion-beam sputtering method, a sputtering method, a deposition method, a molecular beam epitaxy (MBE) method or the like. Upon formation of the magnetic multilayered film 1 (particularly, upon formation of the ferromagnetic layer 40 and the pinning layer 50), it is preferable to carry out the film formation in an atmosphere where an ultimate pressure in a vacuum film forming apparatus is $1 \times 10^{-7}$ Torr or less and water and oxygen partial pressures during film formation are $1 \times 10^{-7}$ Torr or less. By setting such film forming conditions, the exchange coupling magnetic field Hua can be improved. As the substrate 5, glass, silicon, MgO, GaAs, ferrite, AlTiC, $CaTiO_3$ or the like may be used. For the film formation, it is preferable that an external magnetic field of 10 to 3000 e is applied in one direction within the film plane at the film formation of the soft magnetic layer 20. With this operation, the anisotropic magnetic field Hk can be provided to the soft magnetic layer 20. The application of the external magnetic field may be performed at only the film formation time of the soft magnetic field, for example, using a device which is equipped with an electromagnet or the like which is capable of easily controlling an application timing of the magnetic field, and no external magnetic field is applied at the film formation time of the pinning layer 50. Alternatively, a method of applying a constant magnetic field at the film formation time at all times may be used.

As described above, by applying the external magnetic field in one direction within the film plane at least upon film formation of the soft magnetic layer 20 to induce the anisotropic magnetic field Hk, the high frequency characteristic can be further improved.

Furthermore, when forming the pinning player 50, the magnetic field is preferably applied in a direction perpendicular to the direction of the magnetic field applied at the film formation time of the soft magnetic film 20. Specifically, it is applied within the film plane of the magnetic multilayered film and in a direction orthogonal to the measurement current. The magnitude of the applied magnetic field is preferably set in the range of 10 to 3000 e. With this operation, the magnetization direction of the ferromagnetic layer 40 is surely fixed in the applied magnetic field direction (direction perpendicular to the measurement current) by the pinning layer 50, whereby the magnetization of the ferromagnetic layer can be most reasonably set to be antiparallel to the magnetization of the soft magnetic layer 20 whose direction can be freely changed by the signal magnetic field. However, this is not a necessary condition, and the direction of the magnetic field to be applied at the film formation time of the antiferromagnetic layer may be coincident with the direction of the magnetization of the magnetic field to be applied at the film formation time of the soft magnetic layer. At this time, it is preferable that the temperature is decreased while applying the magnetic field in a strip short-side direction (direction perpendicular to the direction of the applied magnetic field when the soft magnetic layer 20 is formed), when the heat treatment at about 200° C. is carried out in the process after the magnetic multilayered film is formed.

Next, the invention of the magnetoresistance effect element having the magnetic multilayered film 1 as described in the foregoing embodiment has been developed and a path through which electrons flow has been considered in detail, thereby achieving the invention of a magnetoresistance device. The magnetoresistance device as described here includes a magnetoresistance effect element, conductive films and electrode portions. More specifically, it is a device which is expressed with a broad conception covering a magnetoresistance effect type head (MR head), an MR sensor, a ferromagnetic memory element, an angle sensor or the like. Further, the magnetoresistance effect type head (MR head) in the present invention includes a spin valve head having a magnetic multilayered film revealing the giant magnetoresistance effect (GMR) and an MR head having a magnetic multilayered film revealing the anisotropic magnetoresistance effect (AMR).

In the following description, a spin valve head will be picked up as a magnetoresistance effect type head (MR head) and described as an example of the magnetoresistance device.

Figure 4:
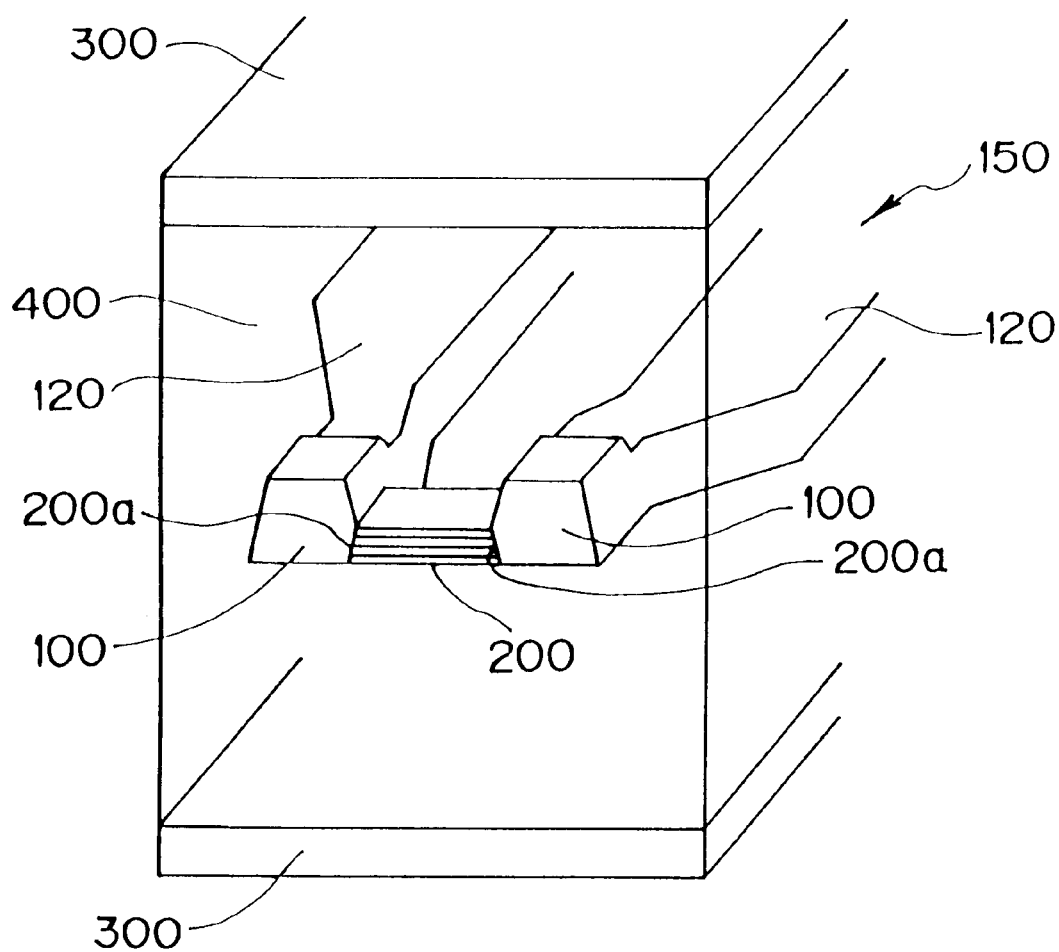
FIG. 4 is a partially omitted sectional view showing an example of a magnetoresistance device according to the present invent ion.

As shown in FIG. 4, a magnetoresistance effect type head (MR head) 150 includes a magnetoresistance effect element 200 serving as a magnetically-sensitive portion for magnetically sensing a signal magnetic field, and electrode portions 100, 100 which are formed at both end portions 200a, 200a of the magnetoresistance effect element 200. Preferably, the whole both end portions 200a, 200a of the magnetoresistance effect element 200 serving as the magnetically-sensitive portion are connected to the electrode portions 100, 100. Conductive films 120, 120 are electrically conducted to the magnetoresistance effect element 200 through the electrode portions 100, 100. In this invention, the conductive film 120 and the electrode portion 100 are individually shown to simplify the description which will be made later, while in most cases the conductive film 120 and the electrode portion 100 are formed integral with each other by a thin film forming method. Accordingly, these elements may be considered as being formed of one member.

The magnetoresistance effect element 200 serving as the magnetically-sensitive portion of the MR head has substantially the same laminate structure as the magnetoresistance effect element 3 having the magnetic multilayered film 1 shown in FIG. 1. That is, the magnetoresistance effect element 200 is replaced by the magnetoresistance effect element 3 having the magnetic multilayered film shown in FIG. 1, so that the magnetoresistance effect element 200 includes a non-magnetic metal layer 30, a ferromagnetic layer 40 formed on one surface of the non-magnetic metal layer 30, a soft magnetic layer 20 formed on the other surface of the non-magnetic metal layer 30, and a pinning layer 50 formed on the ferromagnetic layer 40 (on a surface opposite to a surface abutting the non-magnetic metal layer 30) to pin the magnetization direction of the ferromagnetic layer 40.

The important point is that the thus formed magnetoresistance effect element 200 exhibits the so-called spin-valve type magnetoresistance change. The spin-valve type magnetoresistance change represents that, in the magnetic multilayered film having the non-magnetic metal layer 30, the ferromagnetic layer 40 formed on one surface of the non-magnetic metal layer 30, the soft magnetic layer 20 formed on the other surface of the non-magnetic metal layer 30 and the pinning layer 50 formed on the ferromagnetic layer for pinning the magnetization direction of the ferromagnetic layer 40, an angle formed between the spin of the soft magnetic layer 20 and the spin of the pinned ferromagnetic layer 40 is set to approximately 90 degrees in an acute angle when the external signal magnetic field is zero. In practice, the angle may be 45 to 90 degrees, and most preferably 90 degrees (orthogonalization of magnetization) for causing the magnetoresistance effect curve (MR curve) to be asymmetrical relative to the plus and minus external magnetic fields with respect to the zero external magnetic field.

For achieving the orthogonalization of magnetization, it is necessary that the magnetic multilayered film 1 is subjected to a vacuum heat treatment at no less than the blocking temperature Tb of the pinning layer 50 in the magnetic field. This treatment is called an orthogonalization heat treatment, and a temperature during the treatment is called an orthogonalization temperature. It is also possible to provide the orthogonalization of magnetization in advance by applying the magnetic field during the film formation. However, in this case, the orthogonalization state may be disturbed by the unavoidable heat applied during the subsequent head fabricating process. Thus, it is preferable to carry out the orthogonalization heat treatment at the final stage of the head fabricating process. In the orthogonalization heat treatment, it is preferable to change only the magnetization direction of the pinning layer 50. Preferably, the orthogonalization temperature is higher than the blocking temperature Tb and lower than a temperature at which the induced magnetic anisotropy of the soft magnetic layer 20 is lost. If the orthogonalization heat treatment is carried out when the blocking temperature Tb is higher than the temperature at which the induced magnetic anisotropy of the soft magnetic layer 20 is lost, the magnetization direction of the soft magnetic layer 20 is oriented in a magnetization easy axis direction relative to the external magnetic field so that the magnetoresistance effect curve relative to the external magnetic field is subjected to hysteresis to cause a problem in linearity. On the other hand, when the blocking temperature Tb is too lower than the temperature at which the induced magnetic anisotropy of the soft magnetic layer 20 is lost, the exchange coupling magnetic field Hua is deteriorated due to heat applied during operation of an MR sensor in the magnetic recording system and during the spin valve head fabricating process so that the magnetic multilayered film can not work as a spin valve film. That is, it is preferable to form the pinning layer 50 having the blocking temperature Tb which is a little lower than the temperature at which the induced magnetic anisotropy of the soft magnetic layer 20 is lost, and carry out the orthogonalization heat treatment. In the present invention, by setting a composition of the pinning layer 50 within the foregoing range, the blocking temperature Tb is selectable in the range of 160 to 400° C. The orthogonalization heat treatment is performed in the range of about 150 to 410° C.

As shown in FIG. 4, in the magnetoresistance effect type head (MR head) 150, shield layers 300, 300 are formed so as to sandwich the magnetoresistance effect element 200 and the electrode portions 100, 100 at the upper and lower sides, and a non-magnetic insulation layer 400 is formed at a portion between the magnetoresistance effect element 200 and the shield layers 300, 300.

The same materials and thicknesses as described in the foregoing embodiment of the magnetic multilayered film are preferably used for the ferromagnetic layer 40, the non-magnetic metal layer 30, the soft magnetic layer 20 and the pinning layer 50 used in the magnetoresistance effect element 200 as the magnetically-sensitive portion.

As shown in FIG. 4, the current-flowing electrode portions 100 are arranged so that both end portions 200a, 200a of the magnetoresistance effect element 200 are wholly contacted with the electrode portions 100 in the laminate direction of the magnetoresistance effect element 200. Then, the electrons intensively flow through the portion sandwiched between the soft magnetic layer 20 and the ferromagnetic layer 40. At this time, the electrons are magnetically scattered in accordance with the spin directions of the soft magnetic layer 20 and the ferromagnetic layer 40, so that the resistance is greatly varied. Accordingly, a fine change of the external magnetic field can be detected as a large change of electrical resistance.

The rise-up portion of the MR curve is determined by the rotation of the magnetization of the soft magnetic layer 20. In order to obtain a sharper rise-up of the MR curve, it is preferable that the magnetization direction of the soft magnetic layer 20 is perfectly varied due to the magnetization rotation in accordance with the signal magnetic field. However, actually, magnetic domains occur in the soft magnetic layer 20, and a movement of domain wall and a magnetization rotation occur simultaneously, so that Barkhausen noises are produced and thus the MR head characteristic is not stabilized.

Figure 5:
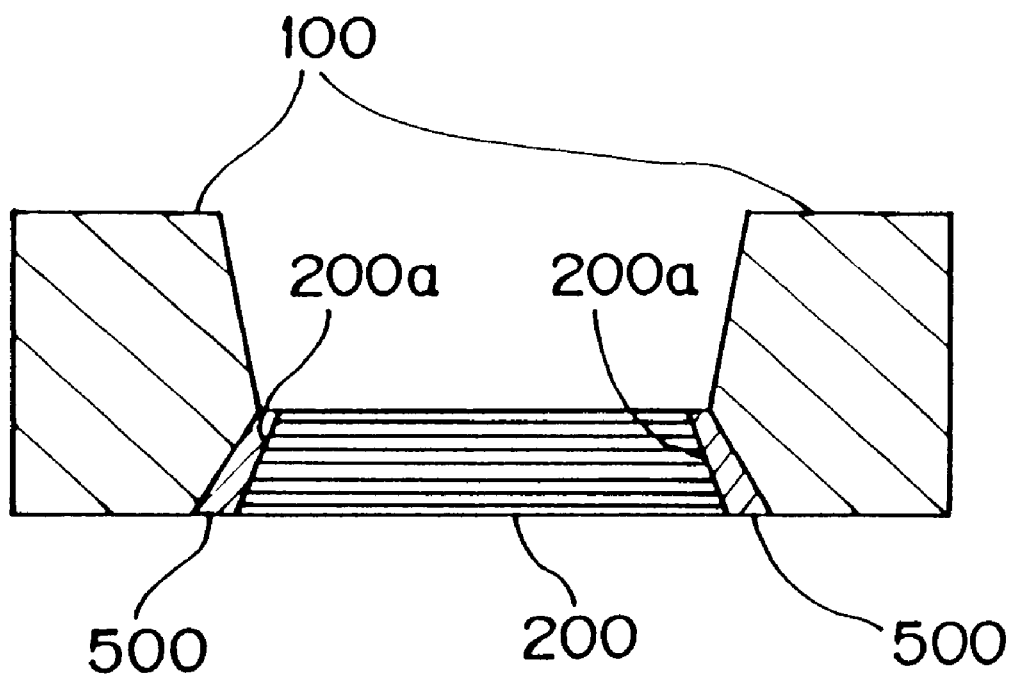
FIG. 5 is a sectional view showing a structure of a magnetoresistance effect element (magnetic multi layered film) and electrode portions of a magnetoresistance device according to the present invention.

Accordingly, as a result of inventor's earnest studies, it has been found out that the noises can be reduced by interposing a linking soft magnetic layer 500, made of, for example, CoPtCr and having a thickness of 50 nm, between the magnetoresistance effect element 200 and each of the electrode portions 100 through which the measurement current flows, as shown in FIG. 5. Of course, in this case, the linking soft magnetic layers 500 are in contact with the whole end portions 200a, 200a of the magnetoresistance effect element 200. The linking soft magnetic layers 500, 500 which are formed adjacent to the magnetoresistance effect element (magnetic multilayered film) are in direct magnetic contact with the soft magnetic layer constituting the magnetic multilayered film. The added linking soft magnetic layer 500 causes the magnetic domains of the soft magnetic layer in the magnetic multilayered film to approach a magnetic monodomain structure and stabilizes the magnetic domain structure. As the result, the soft magnetic layer in the magnetic multilayered film acts in a magnetization rotation mode relative to the signal magnetic field, and an excellent characteristic having no noise can be obtained. The electrode portion 100 is made of a simple substance of Ta, Cu, W, Ti or Au or a combination thereof, and has a monolayer or multilayered structure.

Figure 6:
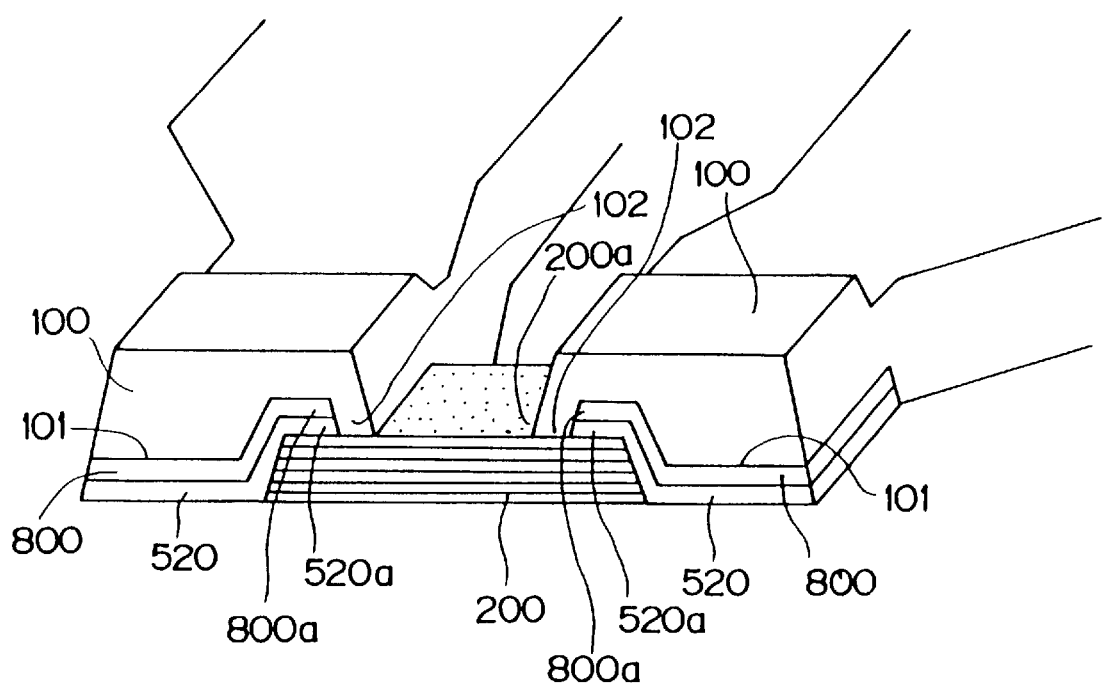
FIG. 6 is a schematic perspective view showing a preferred connection state between a magnetoresistance effect element (magnetic multilayered film) and electrode portions of a magnetoresistance device according to the present invention.

It is particularly preferable that the MR head having the spin valve film of the present invention has a head structure as shown in FIG. 6. Specifically, between the magnetoresistance effect element 200 working as a magnetically-sensitive portion and the electrode portions 100 for conducting the measurement current, linking soft magnetic layers 520 and antiferromagnetic layers 800 (or hard magnetic layer 800) are interposed in order from the side of the magnetoresistance effect element 200 as shown in the drawing. Further, the linking soft magnetic layer 520 and the antiferromagnetic layer 800 (or hard magnetic layer 800) are formed such that their one end side covers a portion of an upper side 200a (near the soft magnetic layer) of the magnetoresistance effect element 200 and their other end side gets under a lower surface 101 of the electrode portion 100 as shown in the drawing. Further, an end portion 102, located at the head center side, of the electrode portion 100 is formed so as to cover a portion of the upper side 200a (near the soft magnetic layer) of the magnetoresistance effect element 200 and also cover upper end portions 520a, 800a of the linking soft magnetic layer 520 and the antiferromagnetic layer 800, respectively. The linking soft magnetic layer 520 is about 10 nm in thickness and made of, for example, NiFe, NiFeCr, NiFeRh, NiFeRu, CoZrNb, FeAlSi and FeZrN. The antiferromagnetic layer 800 is about 50 nm in thickness and made of, for example, $Ru_5Rh_{15}Mn$, NiMn, FeMn, PtMn and $\alpha$-$Fe_2O_3$. The hard magnetic layer 800 is about 50 nm in thickness and made of, for example, CoPt and CoPtCr.

With such an arrangement, through effects of both the linking soft magnetic layers 520 and the anti ferromagnetic layers 800 formed at the magnetoresistance effect element 200, the longitudinal bias can be given quite efficiently so that the MR head which can suppress the Barkhausen noises can be achieved. Further, since the end portions 102 of the electrode portions 100 are formed so as to cover the magnetoresistance effect element 200, the MR head can be provided wherein the signal magnetic field is not lowered at the end portions of the element, and further, the formation of narrow track width, such as no greater than 1 $\mu$m, is easy.

When these MR heads are manufactured, heat treatments such as baking, annealing, resist curing, etc. are indispensable for a patterning process, a flattening process, etc. in the manufacturing process.

In general, a problem of heat-resistance frequently occurs in the magnetoresistance effect element having the foregoing magnetic multilayered film due to the thickness of each layer. According to the magnetoresistance effect element (magnetic multilayered film) of the present invention, the magnetic field is applied to provide anisotropic magnetic field in the magnetic layer, so that, after the film formation, it can endure a heat treatment at a temperature 300° C. or less, generally 100 to 300° C. for about one hour. The heat treatment is generally performed under vacuum, inert gas atmosphere, or atmospheric air. Particularly, if the heat treatment is conducted under a vacuum (pressure-reduced) state at $10^{-7}$ Torr or less, a magnetoresistance effect element (magnetic multilayered film) whose characteristic is extremely less deteriorated can be obtained. Furthermore, the MR characteristic is little deteriorated even by lapping or polishing in the processing step.

In the foregoing magnetoresistance effect element and the magnetoresistance device, the explanation has been made about the spin valve type film (spin valve head) revealing the giant magnetoresistance effect (GMR). However, the present invention is also applicable to a film revealing the anisotropic magnetoresistance effect (AMR), that is, to an MR head using Permalloy.

The MR head using Permalloy comprises, on a substrate, a soft magnetic layer (soft film bias layer) working as a lateral bias layer, a non-magnetic metal layer working as a non-magnetic separation layer, a magnetoresistance effect layer (ferromagnetic layer) made of Permalloy or the like, and an antiferromagnetic layer (pinning layer) for applying a longitudinal bias to the magnetoresistance layer to fix (pin) the magnetization thereof, in the order named. The structure itself of the magnetic multilayered film is similar to the foregoing spin valve type film. An operation of the antiferromagnetic layer (pinning layer) is also the same as that of the foregoing spin valve type film. The soft magnetic layer is made of NiFe alloy and at least one selected from Rh, Cr, Ta, Nb, Zr and Hf and works as the lateral bias layer. For the soft magnetic layer, a soft magnetic material having a large resistivity, such as CoZrMo or NiFeRh, may be preferably used. The non-magnetic metal layer is made of Ta, Ti, $Al_2O_3$ or $SiO_2$ and works as the non-magnetic separation layer. The antiferromagnetic layer (pinning layer) has the composition within the foregoing range of the present invention. This embodiment will be understood more clearly from later-described examples.

The invention of the foregoing magnetoresistance effect element and the invention of the magnetoresistance device (for example, MR head) using such a magnetoresistance effect element will be explained in further detail based on the following concrete examples:

EXAMPLE 1

Figure 7:
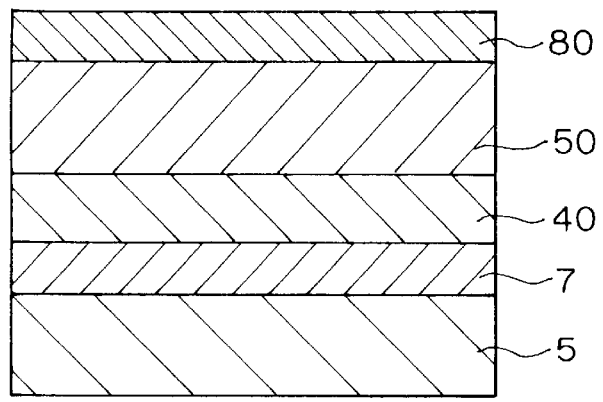
FIG. 7 is a schematic sectional view showing a sample of an exchange coupling film according to the present invention.
Figure 8:
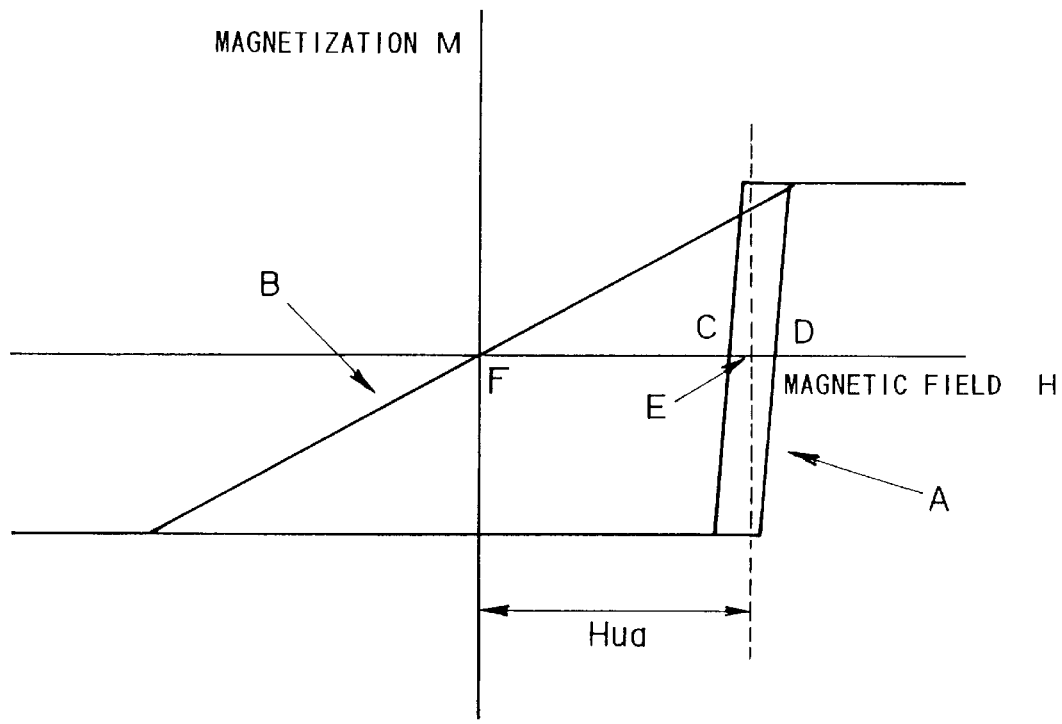
FIG. 8 is a diagram showing an M-H loop according to the present invention.

First, multilayered films as shown in FIG. 7 were prepared as samples for examining the size of the exchange coupling magnetic field Hua. Specifically, each sample included, on a glass substrate 5, a ground layer 7, a ferromagnetic layer 40, an antiferromagnetic layer 50 and a protective layer 80 which were stacked in the order named (composition or the like of the sample will be described later). The sample was prepared by the RF sputtering method and the DC magnetron sputtering method, and the film formation was carried out in a magnetic field by applying an induction magnetic field in a fixed direction. Magnetization curves were described in a magnetic field of 1 KOe using a vibration sample type magnetometer (VSM), and the exchange coupling magnetic field Hua was derived by such magnetization curves. FIG. 8 shows a typical example of the magnetization curves measured by the vibration sample type magnetometer (VSM). In the drawing, a magnetization curve A shows a magnetization easy axis direction (direction in which the magnetic field was applied upon film formation), and a magnetization curve B shows a magnetization hard axis direction. As shown in FIG. 8, the magnetization curve in the direction of the magnetization easy axis shifts from the origin F due to the exchange coupling magnetic field Hua. A magnetic field at point E (middle point between point C and point D) shifting from the origin F is defined as Hua.

Figure 9:
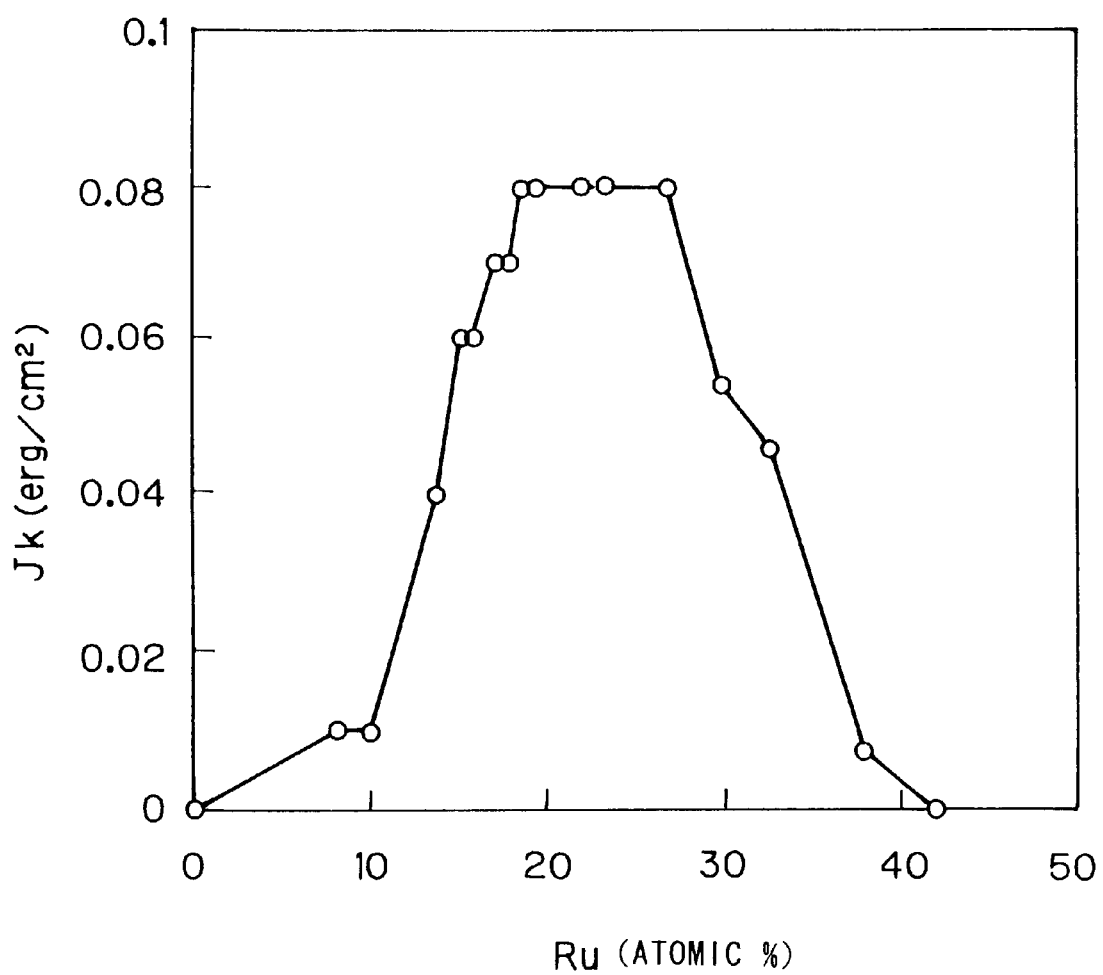
FIG. 9 is a graph showing an influence of an amount of Ru onto Jk.

In the structure of FIG. 7, each of the samples was prepared by stacking on the glass substrate 5 the ground layer 7 (Ta; 5 nm in thickness), the ferromagnetic layer 40 (NiFe; 10 nm in thickness), the antiferromagnetic layer 50 ($Ru_xMn_{100-x}$; 15 nm in thickness) as a pinning layer, and the protective layer 80 (Ta; 5 nm in thickness) in the order named. Specifically, the samples were prepared by changing the composition ratio of $Ru_xMn_{100-x}$ of the antiferromagnetic layer 50. The exchange coupling magnetic field Hua was derived for each of the samples. Then, values of the exchange coupling magnetic field Hua were converted into values of the exchange coupling energy Jk. FIG. 9 shows a relationship between the values of Jk and the Ru contents of the antiferromagnetic layer 50. From FIG. 9, it is seen that the results were excellent in the range where the Ru content ratio x (unit: atomic %) was $15 \leq x \leq 530$, preferably $18 \leq x \leq 27$.

Figure 10:
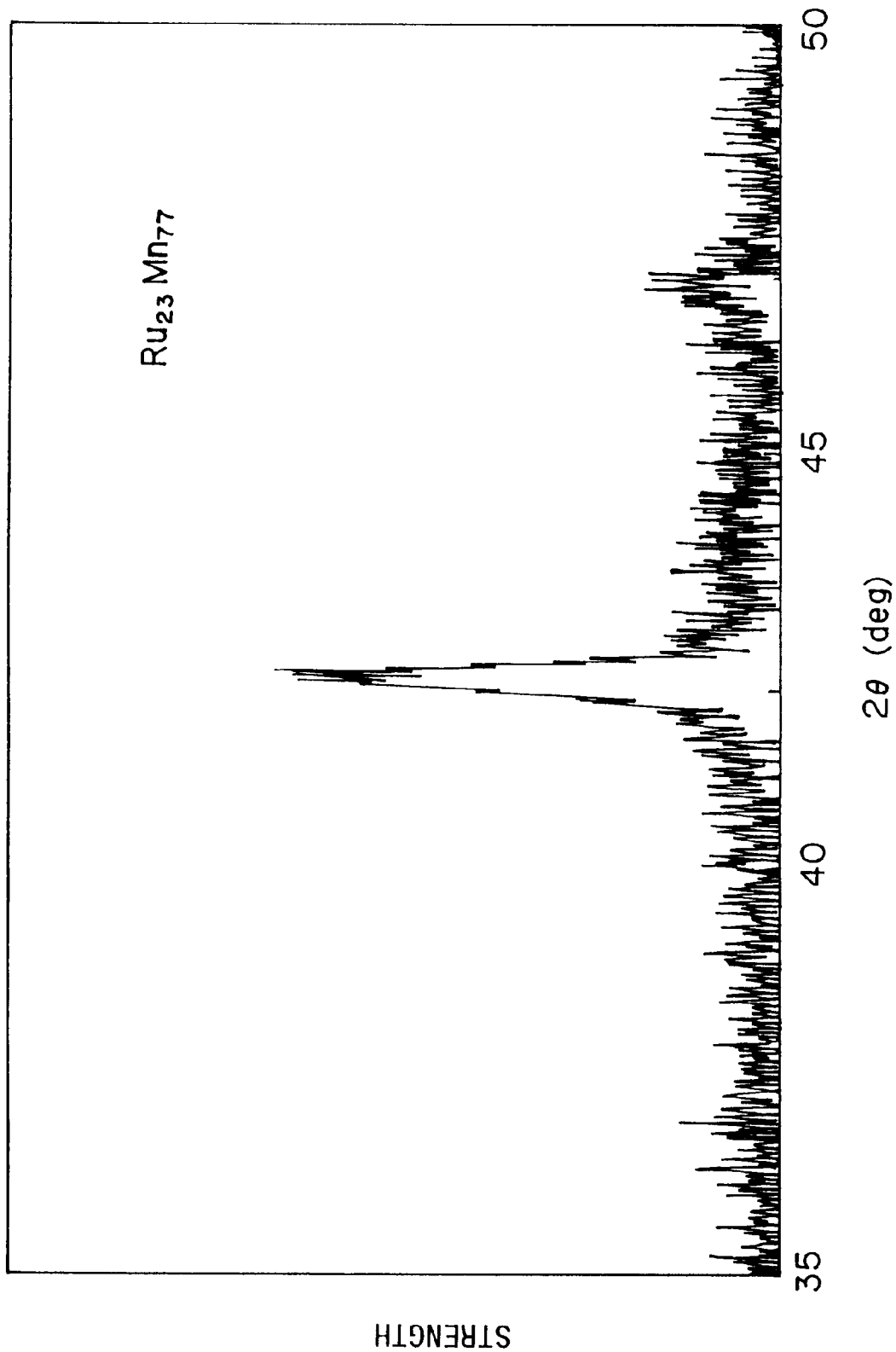
FIG. 10 is a graph showing an X-ray diffraction pattern of a pinning layer made of $Ru_{23}Mn_{77}$ according to the present invention.

FIG. 10 shows the results of X-ray diffraction of a $Ru_{23}Mn_{77}$ film, wherein the peak of the composition was confirmed.

EXAMPLE 2

In the structure of FIG. 7, each of samples was prepared by stacking on the glass substrate 5 the ground layer 7 (Ta; 5 nm in thickness), the ferromagnetic layer 40 (NiFe; 10 nm in thickness), the antiferromagnetic layer 50 ($Ru_xRh_yMn_z$; 15 nm in thickness) as a pinning layer, and the protective layer 80 (Ta; 5 nm in thickness) in the order named. Specifically, the samples were prepared by changing the composition ratios of $Ru_xRh_yMn_z$ (x, y and z represent atomic %) of the antiferromagnetic layers 50. The exchange coupling magnetic field Hua was derived for each of the samples. Then, a distribution diagram of the exchange coupling magnetic field Hua in a ternary diagram of Ru—Rh—Mn was prepared as shown in FIG. 11.

Figure 11:
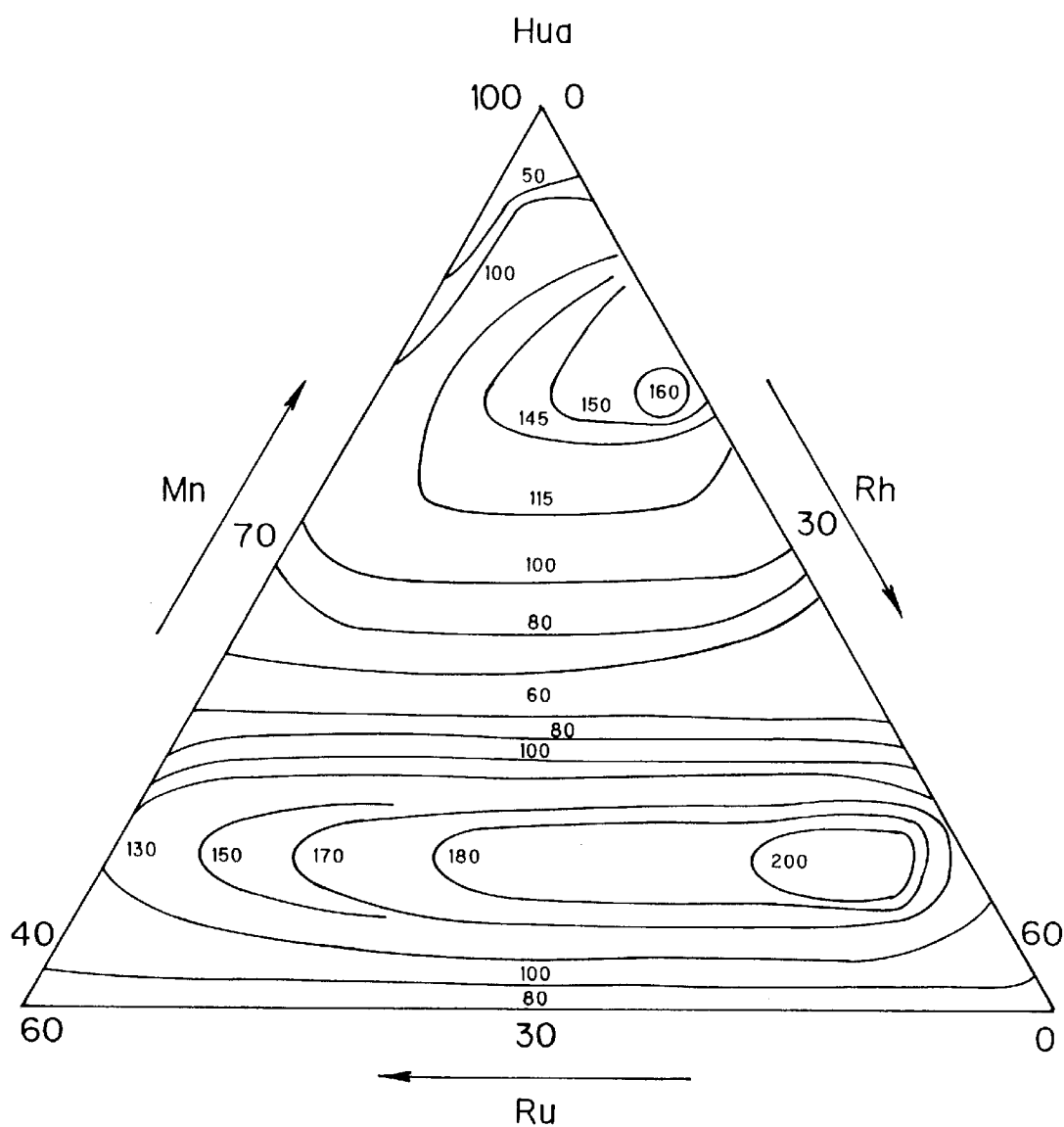
FIG. 11 is a diagram showing a distribution of exchange coupling magnetic field Hua in a ternary diagram of Ru—Rh—Mn.

From the ternary diagram of $Ru_xRh_yMn_z$ shown in FIG. 11, it is seen that the results were excellent in the range where $1 \leq p \leq 30, 1 \leq y \leq 30, 69 \leq z \leq 90$ and $10 \leq x+y \leq 31$ (the unit of x, y and z is atomic %) and in the range where $1 \leq p \leq 59, 1 \leq y \leq 59, 40 \leq z \leq 58$ and $42 \leq x+y \leq 60$ (the unit of x, y and z is atomic %). It is further seen that, by adding Rh or Ru as a third component to the two-element composition of Ru—Mn or Rh—Mn, Hua can be improved and the composition range where Hua is excellent is increased as compared with the two-element composition.

Further, it was confirmed that, even if at least one selected from Rh, Pt, Pd, Au, Ag and Re was used instead of Rh in the foregoing ternary composition, the results were excellent similar to those of the ternary composition shown in FIG. 11.

Figure 12:
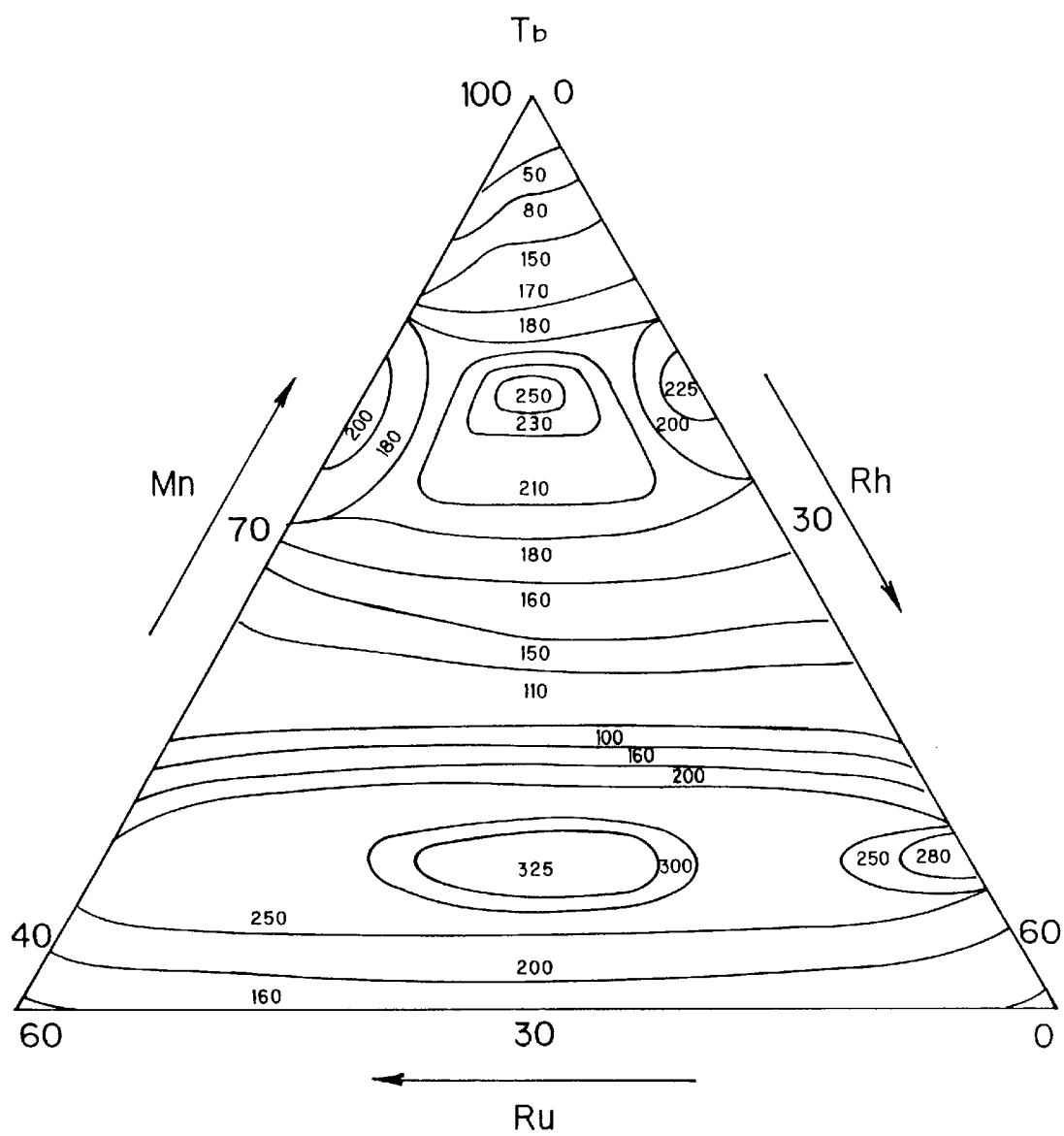
FIG. 12 is a diagram showing a distribution of blocking temperature Tb in a ternary diagram of Ru—Rh—Mn.
Figure 13:
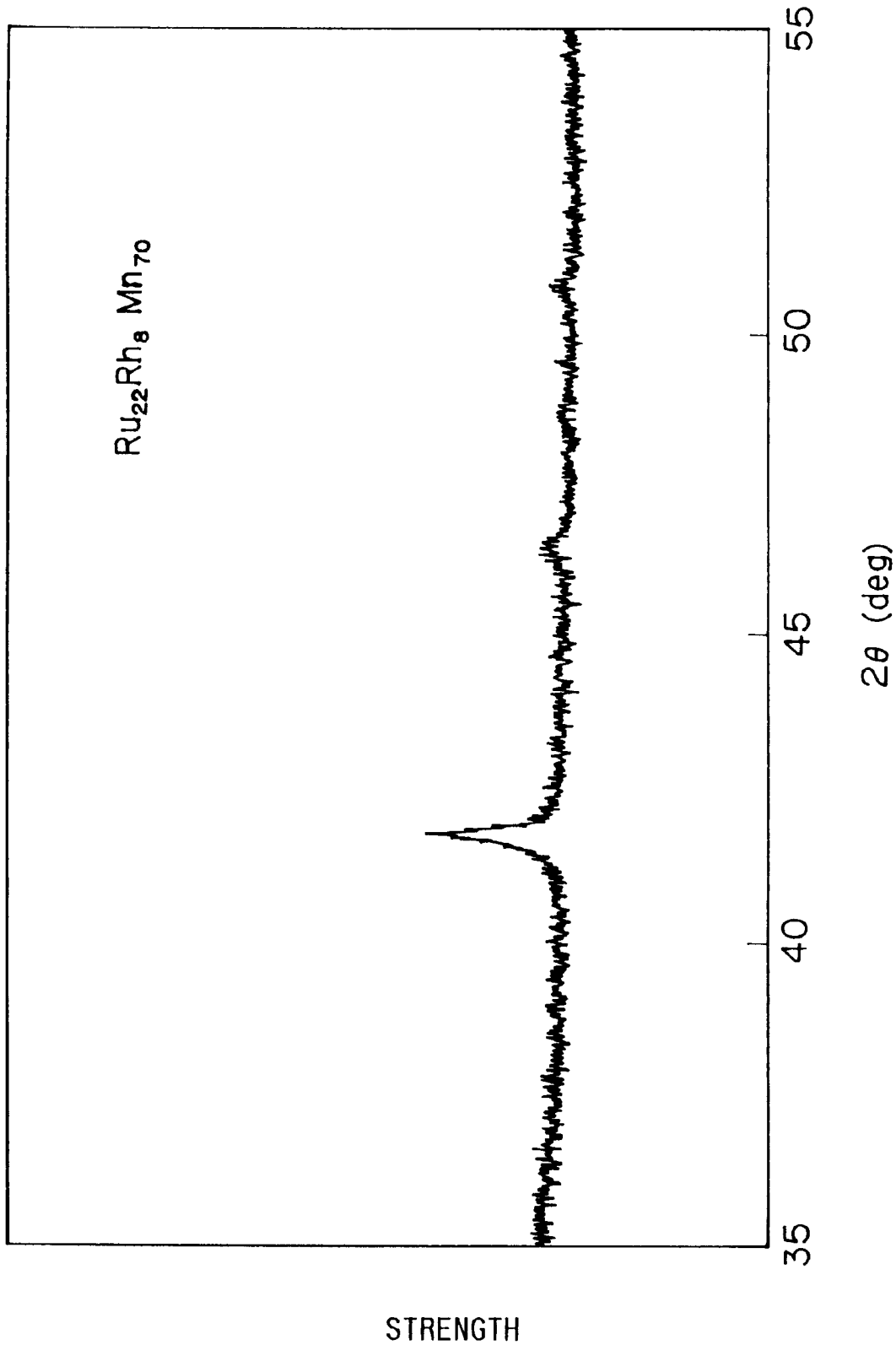
FIG. 13 is a graph showing an X-ray diffraction pattern of a pinning layer made of $Ru_{22}Rh_8Mn_{70}$ according to the present invention.

Subsequently, a distribution diagram of blocking temperature Tb in a ternary diagram of Ru—Rh—Mn was prepared similar to FIG. 11. The results are shown in FIG. 12. From the ternary diagram of Ru,Rh,Mn, shown in FIG. 12, it is seen that very high blocking temperatures Tb (about 160 to 325° C.) can be obtained in the range where $1 \leq x \leq 30$, $1 \leq y \leq 30, 69 \leq z \leq 90$ and $10 \leq x+y \leq 31$ (the unit of x, y and z is atomic %) and in the range where $1 \leq x \leq 59, 1 \leq y \leq 59$, $40 \leq z \leq 58$ and $42 \leq x+y \leq 60$ (the unit of x, y and z is atomic %). From a reverse viewpoint, the blocking temperature Tb can be controlled at 160 to 325° C. in the foregoing composition range. FIG. 13 shows the results of X-ray diffraction of a $Ru_{22}Rh_8Mn_{70}$ film, wherein the peak of the composition was confirmed.

EXAMPLE 3

In the structure of FIG. 7, each of samples was prepared by stacking on the glass substrate 5 the ground layer 7 (Ta; 5 nm in thickness), the ferromagnetic layer 40 ($Ni_{81}FE_{19}$; 10 nm in thickness), the antiferromagnetic layer 50 ($Ru_xM_yMn_z$; 15 nm in thickness) as a pinning layer, and the protective layer 80 (Ta; 5 nm in thickness) in the order named. Specifically, the samples were prepared by changing the composition ratios of $Ru_xM_yMn_z$ of the antiferromagnetic layers 50. The exchange coupling magnetic field Hua, the blocking temperature Tb, the exchange coupling energy Jk and the temperature coefficient Tc of the exchange coupling energy were derived for each of the samples. The results are shown in Table 1.

TABLE 1

| Sample No. | Pinning Layer (m1, m2, m3) | (x, y, z) | Hua (Oe) | Tb (° C.) | Jk (erg/cm$^2$) | Temp. Coef. Tc (erg/cm$^2$ ° C.) |
|---|---|---|---|---|---|---|
| 1-1 | (Ru, —, Mn) | (18, 0, 82) | 100 | 200 | 0.08 | $-5.0 \times 10^{-4}$ |
| 1-2 | (Ru, Rh, Mn) | (5, 5, 90) | 112 | 165 | 0.09 | $-5.3 \times 10^{-4}$ |
| 1-3 | (Ru, Rh, Mn) | (10, 10, 80) | 145 | 250 | 0.11 | $-5.1 \times 10^{-4}$ |
| 1-4 | (Ru, Rh, Mn) | (5, 15, 80) | 150 | 210 | 0.12 | $-3.0 \times 10^{-4}$ |
| 1-5 | (Ru, Rh, Mn) | (5, 25, 70) | 110 | 170 | 0.09 | $-2.7 \times 10^{-4}$ |
| 1-6 | (Ru, Rh, Mn) | (15, 7, 78) | 120 | 210 | 0.09 | $-5.2 \times 10^{-4}$ |
| 1-7 | (Ru, Rh, Mn) | (5, 15, 80) | 155 | 210 | 0.12 | $-3.0 \times 10^{-4}$ |
| 1-8 | (Ru, Rh, Mn) | (20, 5, 75) | 110 | 180 | 0.09 | $-2.7 \times 10^{-4}$ |
| 1-9 | (Ru, Rh, Mn) | (10, 36, 54) | 200 | 240 | 0.15 | $-5.6 \times 10^{-4}$ |
| 1-10 | (Ru, Rh, Mn) | (40, 5, 55) | 130 | 250 | 0.10 | $-5.9 \times 10^{-4}$ |
| 1-11 | (Ru, Rh, Mn) | (4, 42, 54) | 155 | 300 | 0.12 | $-6.1 \times 10^{-4}$ |
| 1-12 | (Ru, Rh, Mn) | (30, 16, 54) | 170 | 250 | 0.13 | $-6.5 \times 10^{-4}$ |
| 1-13 | (Ru, Pt, Mn) | (5, 5, 90) | 125 | 220 | 0.10 | $-4.8 \times 10^{-4}$ |
| 1-14 | (Ru, Pt, Mn) | (10, 5, 85) | 145 | 260 | 0.11 | $-7.0 \times 10^{-4}$ |
| 1-15 | (Ru, Pt, Mn) | (10, 10, 80) | 152 | 275 | 0.12 | $-4.5 \times 10^{-4}$ |
| 1-16 | (Ru, Pt, Mn) | (15, 5, 80) | 173 | 280 | 0.13 | $-6.4 \times 10^{-4}$ |
| 1-17 | (Ru, Pt, Mn) | (22, 23, 55) | 200 | 400 | 0.15 | $-3.2 \times 10^{-4}$ |
| 1-18 | (Ru, Pt, Mn) | (15, 31, 54) | 230 | 350 | 0.18 | $-3.0 \times 10^{-4}$ |
| 1-19 | (Ru, Pd, Mn) | (10, 10, 80) | 110 | 215 | 0.09 | $-7.0 \times 10^{-4}$ |
| 1-20 | (Ru, Au, Mn) | (15, 5, 80) | 105 | 190 | 0.08 | $-6.6 \times 10^{-4}$ |
| 1-21 | (Ru, Ag, Mn) | (5, 5, 90) | 110 | 180 | 0.09 | $-7.0 \times 10^{-4}$ |
| 1-22 | (Ru, Re, Mn) | (12, 7, 81) | 120 | 190 | 0.09 | $-6.3 \times 10^{-4}$ |
| 1-23 (Comp) | (—, Rh, Mn) | (0, 5, 95) | 50 | 60 | 0.03 | — |
| 1-24 (Comp) | (—, Fe, Mn) | (0, 50, 50) | 100 | 150 | 0.08 | $-2.6 \times 10^{-4}$ |
| 1-25 (Comp) | (Ru, Rh, Mn) | (20, 42, 38) | 10 | 20 | 0.01 | — |
| 1-26 (Comp) | (Ru, Pt, Mn) | (15, 25, 60) | 10 | 50 | 0.01 | — |

Comp: Comparative

In Table 1, material elements corresponding to $Ru_xM_yMn_z$ are represented by (m1, m2, m3). From the results shown in Table 1, it is seen that the excellent exchange coupling film can be provided by using the pinning layer (antiferromagnetic layer) having the composition within the range of the present invention.

A sample having a pinning layer of a four-element composition ($Ru_{10}Rh_5Pt_5Mn_{80}$) was further prepared and subjected to the characteristic evaluation similar to the above. The results were Hua=1500 e, Tb=260° C. Jk=0.12 erg/cm$^2$ and Tc=$-7 \times 10^{-4}$ erg/cm$^2$ ° C.

Figure 14:
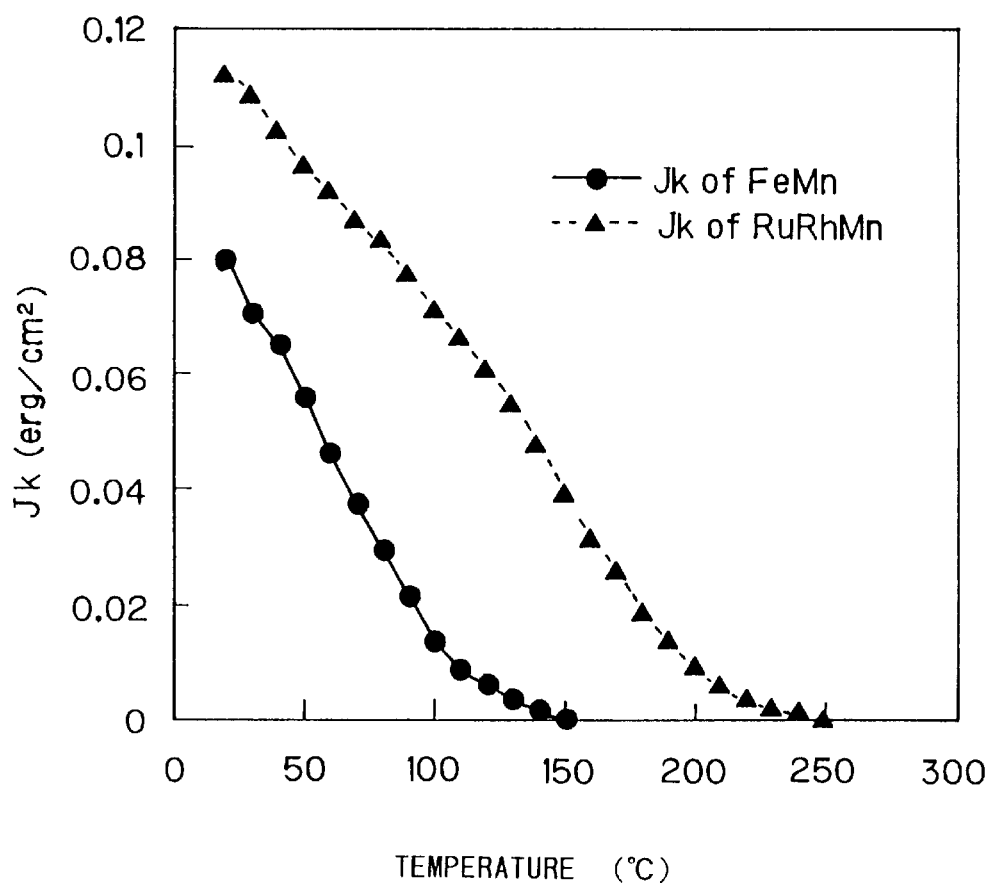
FIG. 14 is a graph showing a relationship between exchange coupling energy Jk and temperature in a magnetoresistance effect element (magnetic multilayered film) according to the present invention.

Further, a relationship between the exchange coupling energy Jk and the temperature were examined about the sample 1-3 in Table 1. The results are shown in FIG. 14. As a comparative example, the examination results about a sample having a pinning layer (antiferromagnetic layer; 15 nm in thickness) of Fe—Mn are also shown in the drawing. From the graph shown in FIG. 14, it is seen that the sample of the present invention revealed quite a high blocking temperature Tb (250° C.) as compared with Fe—Mn (Tb= 150° C. in case of Fe—Mn). Further, attention is paid to slopes (temperature coefficients Tc) of the graph of the exchange coupling energy Jk and the ambient temperature. The temperature coefficient Tc represents a thermal stability relative to the ambient temperature. In case of using FeMn for the antiferromagnetic layer, the temperature coefficient Tc at 80° C. to 130° C. was $-2.6 \times 10^{-4}$ erg/cm$^2$ ° C. On the other hand, in case of the sample 1-3, the temperature coefficient Tc was $-5.1 \times 10^{-4}$ erg/cm$^2$ ° C. Accordingly, it is seen that the sample 1-3 is excellent in thermal stability. The temperature coefficients were derived in the range of 80° C. to 130° C., supposing the ambient temperature when the MR head was used in a hard disk drive.

EXAMPLE 4

Samples 2-1 to 2-7 were prepared by changing atmosphere conditions upon film formation of the pinning layer (antiferromagnetic layer) of $Ru_{10}Rh_{10}Mn_{80}$ of the sample 1-3, and influences of the impurity concentrations upon the characteristics of the magnetic films were examined. Samples 2-8 to 2-32 were further prepared by changing compositions of pinning layers (antiferromagnetic layers) and atmosphere conditions upon formation of the pinning layers, and influences of the impurity concentrations upon the characteristics of the magnetic films were examined. The results are shown in Table 2.

TABLE 2

| Sample No. | Pinning Layer (m1, m2, m3) | (x, y, z) | Oxygen Conc. (ppm) | Carbon Conc. (ppm) | Sulfer Conc. (ppm) | Chlorine Conc. (ppm) | Tb (° C.) | Jk (erg/cm$^2$) | Temp. Coef. Tc (erg/cm$^2$ ° C.) |
|---|---|---|---|---|---|---|---|---|---|
| 2-1 | (Ru, Rh, Mn) | (10, 10, 80) | 40 | 50 | 60 | 70 | 250 | 0.11 | $-5.1 \times 10^{-4}$ |
| 2-2 | (Ru, Rh, Mn) | (10, 10, 80) | 120 | 70 | 80 | 120 | 220 | 00 10 | $-4.8 \times 10^{-4}$ |
| 2-3 | (Ru, Rh, Mn) | (10, 10, 80) | 600 | 210 | 180 | 200 | 200 | 0.08 | $-4.5 \times 10^{-4}$ |
| 2-4 | (Ru, Rh, Mn) | (10, 10, 80) | 950 | 330 | 220 | 260 | 180 | 0.08 | $-3.0 \times 10^{-4}$ |
| 2-5 | (Ru, Rh, Mn) | (10, 10, 80) | 2500 | 360 | 260 | 310 | 170 | 0.08 | $-2.8 \times 10^{-4}$ |
| 2-6 (Comp) | (Ru, Rh, Mn) | (10, 10, 80) | 6000 | 400 | 320 | 380 | 130 | 0.05 | $-1.8 \times 10^{-4}$ |
| 2-7 (Comp) | (Ru, Rh, Mn) | (10, 10, 80) | 7000 | 120000 | 11000 | 15800 | 110 | 0.02 | $-1.5 \times 10^{-4}$ |

TABLE 2-continued

| Sample No. | Pinning Layer (m1, m2, m3) | (x, y, z) | Oxygen Conc. (ppm) | Carbon Conc. (ppm) | Sulfer Conc. (ppm) | Chlorine Conc. (ppm) | Tb (° C.) | Jk (erg/cm$^2$) | Temp. Coef. Tc (erg/cm$^2$ ° C.) |
|---|---|---|---|---|---|---|---|---|---|
| 2-8 (Comp) | (Ru, Rh, Mn) | (8, 1, 0, 82) | 900 | 6500 | 1400 | 500 | 150 | 0.05 | $-1.9 \times 10^{-4}$ |
| 2-9 (Comp) | (Ru, Rh, Mn) | (8, 10, 82) | 2000 | 800 | 6000 | 1800 | 145 | 0.04 | $-1.9 \times 10^{-4}$ |
| 2-10 (Comp) | (Ru, Rh, Mn) | (8, 10, 82) | 2100 | 1900 | 500 | 6500 | 140 | 0 04 | $-1.8 \times 10^{-4}$ |
| 2-11 | (Ru, Rh, Mn) | (8, 10, 82) | 620 | 370 | 99 | 560 | 225 | 0 18 | $-5.1 \times 10^{-4}$ |
| 2-12 | (Ru, Rh, Mn) | (8, 10, 82) | 520 | 2400 | 120 | 390 | 210 | 0 16 | $-4.8 \times 10^{-4}$ |
| 2-13 | (Ru, Rh, Mn) | (8, 10, 82) | 430 | 260 | 2100 | 520 | 210 | 0 16 | $-4.8 \times 10^{-4}$ |
| 2-14 | (Ru, Rh, Mn) | (8, 10, 82) | 490 | 390 | 100 | 2300 | 210 | 0 16 | $-4.8 \times 10^{-4}$ |
| 2-15 | (Ru, Rh, Mn) | (10, 36, 54) | 620 | 370 | 100 | 560 | 260 | 0 25 | $-5.2 \times 10^{-4}$ |
| 2-16 | (Ru, Rh, Mn) | (40, 5, 55) | 590 | 380 | 110 | 480 | 250 | 0 23 | $-5.1 \times 10^{-4}$ |
| 2-17 | (Ru, Rh, Mn) | (40, 5, 55) | 2300 | 390 | 100 | 500 | 170 | 0.06 | $-2.5 \times 10^{-4}$ |
| 2-18 | (Ru, Rh, Mn) | (40, 5, 55) | 490 | 2100 | 100 | 500 | 220 | 0.17 | $-4.9 \times 10^{-4}$ |
| 2-19 | (Ru, Rh, Mn) | (40, 5, 55) | 530 | 500 | 2200 | 500 | 225 | 0.18 | $-4.9 \times 10^{-4}$ |
| 2-20 | (Ru, Rh, Mn) | (40, 5, 55) | 490 | 380 | 200 | 2400 | 220 | 0.18 | $-4.9 \times 10^{-4}$ |
| 2-21 (Comp) | (Ru, Rh, Mn) | (40, 5, 55) | 5500 | 6000 | 350 | 1200 | 150 | 0.04 | $-1.5 \times 10^{-4}$ |
| 2-22 (Comp) | (Ru, Rh, Mn) | (40, 5, 55) | 5200 | 5100 | 520 | 670 | 155 | 0.04 | $-1.5 \times 10^{-4}$ |
| 2-23 | (Ru, —, Mn) | (23, 0, 77) | 720 | 390 | 110 | 540 | 210 | 0.16 | $-4.6 \times 10^{-4}$ |
| 2-24 | (Ru, Pt, Mn) | (10, 38, 52) | 560 | 390 | 96 | 570 | 270 | 0.26 | $-5.0 \times 10^{-4}$ |
| 2-25 | (Ru, Pd, Mn) | (11, 39, 50) | 530 | 360 | 97 | 580 | 260 | 0.25 | $-5.1 \times 10^{-4}$ |
| 2-26 | (Ru, Au, Mn) | (12, 39, 49) | 420 | 380 | 89 | 470 | 265 | 0.25 | $-5.2 \times 10^{-4}$ |
| 2-27 | (Ru, —, Mn) | (23, 0, 77) | 2100 | 490 | 120 | 630 | 175 | 0.07 | $-3.1 \times 10^{-4}$ |
| 2-28 | (Ru, Rh, Mn) | (10, 38, 52) | 2800 | 450 | 105 | 690 | 170 | 0.07 | $-2.8 \times 10^{-4}$ |
| 2-29 | (Ru, Pd, Mn) | (11, 39, 50) | 2500 | 390 | 113 | 640 | 165 | 0.06 | $-2.1 \times 10^{-4}$ |
| 2-30 (Comp) | (Ru, Pt, Mn) | (4, 15, 81) | 5500 | 5500 | 350 | 1200 | 135 | 0.05 | $-1.7 \times 10^{-4}$ |
| 2-31 (Comp) | (Ru, Pd, Mn) | (1, 19, 80) | 5200 | 5300 | 120 | 630 | 140 | 0.04 | $-1.5 \times 10^{-4}$ |
| 2-32 (Comp) | (Ru, —, Mn) | (21, —, 79) | 5400 | 5300 | 5100 | 3200 | 130 | 0.03 | $-1.1 \times 10^{-4}$ |

From the results shown in Table 2, it is seen that, as the concentration of oxygen, carbon, sulfur or chlorine increases, the blocking temperature Tb, the exchange coupling energy Jk and the slope of the exchange coupling energy Jk are deteriorated, respectively. Thus, it is necessary to set the concentrations of oxygen, carbon, sulfur and chlorine to be no more than 5,000 atomic ppm.

EXAMPLE 5

Samples were prepared by changing conditions, such as ultimate pressure in the film forming apparatus and oxygen partial pressure, upon film formation of the pinning layer (antiferromagnetic layer) of $Ru_{10}Rh_{10}Mn_{80}$ of the sample 1-3, and influences of these pressure conditions upon the characteristics of the magnetic films were examined. The results are shown in Table 3.

TABLE 3

| Sample No. | Ultimate Pressure (Torr) | Oxygen Partial Pressure (Torr) | Tb (° C.) | Jk (erg/cm$^2$) | Temp. Coef. Tc (erg/cm$^2$ ° C.) |
|---|---|---|---|---|---|
| 3-1 | $4.3 \times 10^{-8}$ | $2.0 \times 10^{-8}$ | 250 | 0.11 | $-5.1 \times 10^{-4}$ |
| 3-2 | $6.8 \times 10^{-9}$ | $1.0 \times 10^{-9}$ | 260 | 0.12 | $-5.3 \times 10^{-4}$ |
| 3-3 | $7.0 \times 10^{-10}$ | $7.0 \times 10^{-11}$ | 280 | 0.15 | $-5.5 \times 10^{-4}$ |
| 3-4 | $7.6 \times 10^{-9}$ | $1.0 \times 10^{-10}$ | 180 | 0.08 | $-3.0 \times 10^{-4}$ |
| 3-5 | $2.5 \times 10^{-8}$ | $3.0 \times 10^{-8}$ | 170 | 0.08 | $-2.8 \times 10^{-4}$ |
| 3-6 (Comp) | $7.6 \times 10^{-9}$ | $3.0 \times 10^{-7}$ | 150 | 0.05 | $-1.6 \times 10^{-4}$ |
| 3-7 (Comp) | $8.2 \times 10^{-9}$ | $6.0 \times 10^{-7}$ | 140 | 0.04 | $-1.5 \times 10^{-4}$ |

From the results shown in Table 3, it is seen that, as the ultimate pressure and the oxygen partial pressure increase, the blocking temperature Tb, the exchange coupling energy Jk and the slope of the exchange coupling energy Jk are deteriorated, respectively. Thus, it is necessary to carry out the film formation under sufficiently reduced ultimate pressure and oxygen partial pressure (and water partial pressure), wherein the ultimate pressure is $1 \times 10^{-7}$ Torr or lower and the water and oxygen partial pressures during film formation are $1 \times 10^{-7}$ Torr or lower.

EXAMPLE 6

Spin valve type magnetoresistance effect elements as shown in FIG. 1 were prepared. Each of the element samples was prepared by stacking, on a substrate 5 (AlTiC with $Al_2O_3$), a ground layer 7 (Ta; 5 nm in thickness), a soft magnetic layer 20, a non-magnetic metal layer 30 (Cu; 2.5 nm in thickness), a ferromagnetic layer 40, a pinning layer (antiferromagnetic layer) 50 and a protective layer 80 (Ta; 5 nm in thickness) in the order named. Specifically, the samples were prepared by changing materials and thicknesses of the soft magnetic layers 20, the ferromagnetic layers 40 and the pinning layers 50 as shown in Table 4. In the sample preparation, the applied magnetic field during film formation was in a longitudinal direction of the sample. The MR change ratio ΔR/R, the exchange coupling magnetic field Hua and the blocking temperature Tb were derived for each of the samples. The results are shown in Table 4. For resistance measurement, samples of 0.4×6 mm were prepared from the samples shown in Table 4. Resistances were measured by the four-terminal method while applying the external magnetic field to the plane in a direction perpendicular to the current, changing from −300 to 3000 e. The MR change ratios ΔR/R were derived from the measured resistances. The MR change ratio ΔR/R was calculated from the following equation:

$$\Delta R/R = (\rho_{max} - \rho_{sat}) \times 100 / \rho_{sat} (\%)$$

wherein the maximum resistivity is $\rho_{max}$ and the minimum resistivity is $\rho_{sat}$.

TABLE 4

| Sample | Soft Magnetic Layer (Thickness (Å)) | Ferromagnetic Layer (Thickness (Å)) | Pinning Layer (Thickness (Å)) | MR (%) | Hua (Oe) | Tb (° C) |
|---|---|---|---|---|---|---|
| 4-1 | NiFe (70) | Co (20) | $Ru_{10}Rh_{10}Mn$ (100) | 5.5 | 480 | 250 |
| 4-2 | $(NiFe)_{85}Co_{15}$/Co (50/8) | Co (30) | $Ru_5Rh_{15}Mn$ (90) | 6.1 | 500 | 200 |
| 4-3 | $(NiFe)_{90}Co_{10}$/Co (50/6) | Co (30) | $Ru_{15}Rh_7Mn$ (110) | 6.0 | 420 | 210 |
| 4-4 | NiFe (70) | $(NiFe)_{30}Co_{70}$ (30) | $Ru_5Pt_{15}Mn$ (120) | 5.7 | 540 | 255 |
| 4-5 | NiFe (70) | $(NiFe)_{30}Co_{70}$ (25) | $Ru_{10}Pt_{10}Mn$ (110) | 5.9 | 510 | 270 |
| 4-6 | NiFe (70) | $(NiFe)_{50}Co_{50}$ (30) | $Ru_{10}Pd_{10}Mn$ (100) | 6.0 | 410 | 240 |
| 4-7 | NiFe (70) | $(NiFe)_{50}Co_{50}$ (30) | $Ru_{10}Au_{10}Mn$ (110) | 5.7 | 530 | 200 |
| 4-8 | NiFe (70) | $(NiFe)_{50}Co_{50}$ (25) | $Ru_{10}Ag_{10}Mn$ (120) | 5.1 | 410 | 180 |
| 4-9 | NiFe (70) | $(NiFe)_{50}Co_{50}$ (30) | $Ru_{10}Re_{10}Mn$ (120) | 5.8 | 460 | 205 |
| 4-10 (Comp) | NiFe (70) | NiFe (30) | $Fe_{50}Mn_{50}$ (100) | 2.5 | 400 | 145 |
| 4-11 (Comp) | NiFe (70) | Co (20) | $Ni_{50}Mn_{50}$ (200) | 2.9 | 600 | 250 |

From the results shown in Table 4, it is seen that the samples of the present invention revealed the excellent MR change ratios, exchange coupling magnetic fields Hua and blocking temperatures Tb. In a sample 4-10 (comparative example), since the pinning layer was made of FeMn, the blocking temperature Tb was 145° C. which is low and not preferable. Further, although not shown in Table 4, there was also a problem in corrosion resistance. A sample 4-11 (comparative example) revealed good values of the exchange coupling magnetic field Hua and the blocking temperature Tb. However, since the pinning layer was made of NiMn, the heat treatment was required for a long time at high temperature for generating the exchange coupling magnetic field Hua. Thus, due to diffusion of Ni and Cu, the MR change ratio was reduced to 2.9% which is low and not preferable.

EXAMPLE 7

Samples were prepared for evaluating corrosion resistances. Specifically, the samples were prepared by directly forming, on glass substrates of 10×20 mm, antiferromagnetic films having 100 to 150 Å in thickness and having compositions shown in Table 5, respectively. For each of the samples shown in Table 5, natural potential measurement (anticorrosion anodic polarization test) was carried out, wherein Ag/AgCl was used as reference electrodes and a solution obtained by adding 1 m mol NaCl into a boric acid buffer solution was used. The results are shown in Table 5.

TABLE 5

| Sample No. | Antiferromagnetic Layer Material | Thickness (Å) | Natural Potential (mV) |
|---|---|---|---|
| 5-1 | $Ru_{18}Mn$ | 130 | −150 |
| 5-2 | $Ru_{10}Rh_{10}Mn$ | 120 | −120 |
| 5-3 | $Ru_5Rh_{15}Mn$ | 100 | −90 |
| 5-4 | $Ru_5Pt_{15}Mn$ | 120 | −50 |
| 5-6 | $Ru_{10}Pd_{10}Mn$ | 120 | −100 |
| 5-5 | $Ru_{10}Pt_{10}Mn$ | 100 | −70 |
| 5-7 | $Ru_{10}Au_{10}Mn$ | 120 | −40 |
| 5-8 | $Ru_{10}Ag_{10}Mn$ | 120 | −60 |
| 5-9 | $Ru_{10}Re_{10}Mn$ | 120 | −100 |
| 5-10 (Comp) | NiFe | 100 | −150 |
| 5-11 (Comp) | Fe | 100 | −260 |
| 5-12 (Comp) | FeMn | 150 | −700 |
| 5-13 (Comp) | Co | 100 | −130 |

From the results shown in Table 5, it is seen that the samples of the present invention revealed the natural potentials of −150 to −40 mV, and thus the excellent corrosion resistances.

In general, noble metal reveals a positive natural potential and is excellent in corrosion resistance. On the other hand, even Permalloy, which is said to be relatively good in corrosion resistance, reveals about −150 mV. A comparative example of FeMn reveals a large negative value of about −700 mV. In Table 5, the corrosion resistance increases as approaching to 0 mV.

EXAMPLE 8

Figure 15:
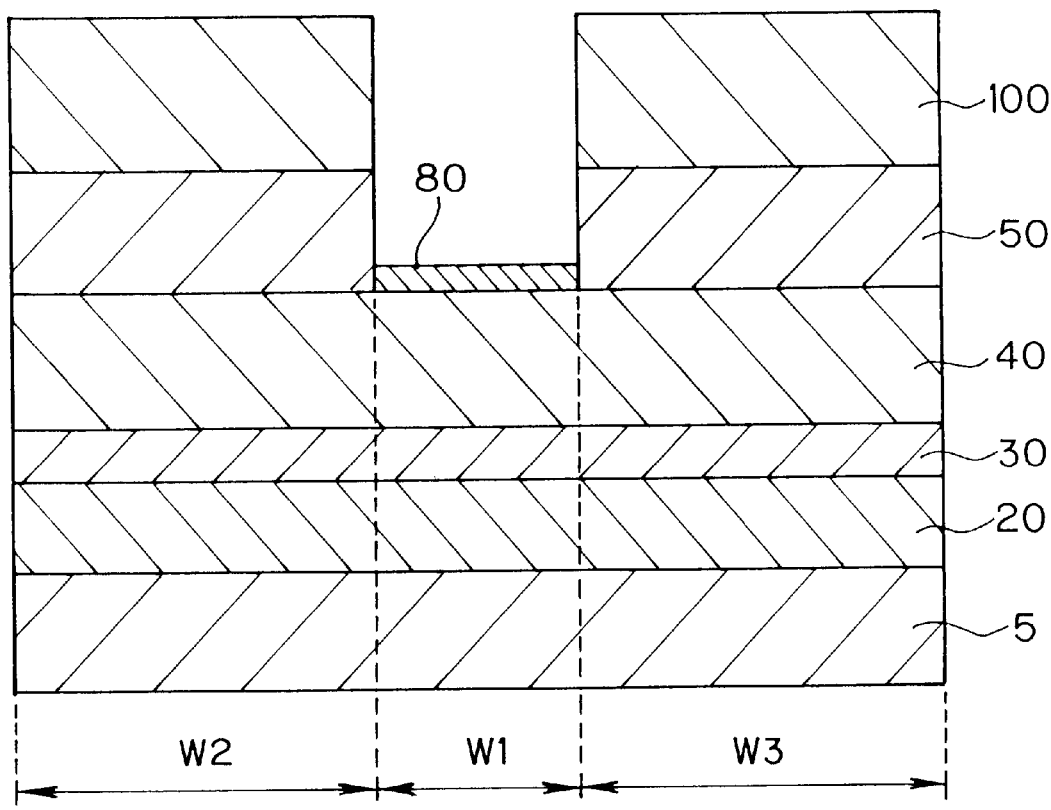
FIG. 15 is a sectional view showing an anisotropy magnetoresistance effect (AMR) type magnetoresistance effect type head according to the present invention.

An anisotropy magnetoresistance effect (AMR) type magnetoresistance effect type head as shown in FIG. 15 was prepared in the following manner:

First, a laminate substrate was prepared by forming a magnetic layer as a lower shield and an $Al_2O_3$ gap film in turn on an AlTiC substrate 5 with an $Al_2O_3$ ground film formed on the surface thereof. Then, on the laminate substrate, NiFeRh (17 nm in thickness) as a soft magnetic layer 20 for applying a lateral bias to the MR element, Ta (10 nm in thickness) as a non-magnetic metal layer (non-magnetic separation layer) 30, NiFe (25 nm in thickness) as a ferromagnetic layer (magnetoresistance effect layer) 40, and Ta (5 nm in thickness) as a protective layer 80 were stacked in the order named using the film forming technique, such as the magnetron sputtering.

Then, after adhering a photoresist on the protective layer 80, a pattern for protecting a central active region WI essentially corresponding to a track width was formed. Subsequently, end passive regions W2 and W3 not masked were etched by the reverse sputtering method or the ion-milling method. During this etching process, the protective layer 80 and a small portion of the ferromagnetic layer (magnetoresistance effect layer) 40 were removed. Thereafter, $Ru_{15}Rh_5Mn_{80}$ as a pinning layer (antiferromagnetic layer) 50 and electrode layers 100 were formed. After formation of the pinning layer (antiferromagnetic layer) 50 and the electrode layers 100, the resist film was removed through the lift-off process so that the anisotropy magnetoresistance effect (AMR) type magnetoresistance effect type head was prepared as shown in FIG. 15. Although not shown in FIG. 15, an upper shield layer and a lower shield layer were formed via an $Al_2O_3$ gap film, and an inductive head portion was further formed on the upper shield layer.

EXAMPLE 9

Figure 16:
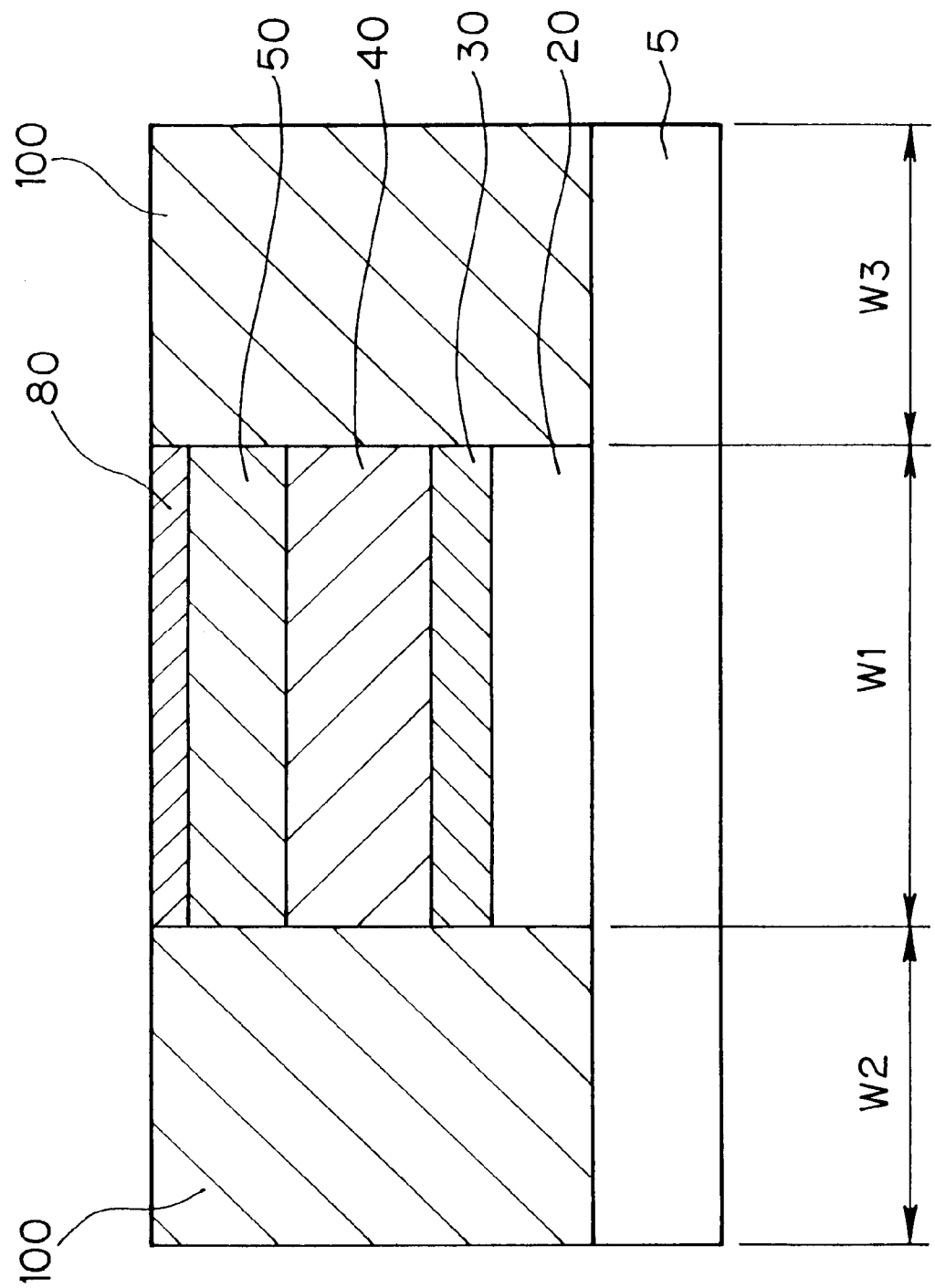
FIG. 16 is a sectional view showing an anisotropy magnetoresistance effect (AMR) type magnetoresistance effect type head according to the present invention.

As a modification of the foregoing example 8, an anisotropy magnetoresistance effect (AMR) type magnetoresistance effect type head as shown in FIG. 16 was prepared in the following manner:

First, on an AlTiC substrate 5 with an $Al_2O_3$ ground film formed on the surface thereof, NiFeRh (17 nm in thickness) as a soft magnetic layer 20 for applying a lateral bias to the MR element, Ta (10 nm in thickness) as a non-magnetic metal layer (non-magnetic separation layer) 30, NiFe (25 nm in thickness) as a ferromagnetic layer (magnetoresistance effect layer) 40, $Ru_{15}Rh_5Mn_{80}$ (20 nm in thickness) as a pinning layer (antiferromagnetic layer) 50, and Ta (5 nm in thickness) as a protective layer 80 were stacked in the order named using the film forming technique, such as the magnetron sputtering.

Then, after adhering a photoresist on the protective layer 80, a pattern for protecting a central active region Wl essentially corresponding to a track width was formed. Subsequently, end passive regions W2 and W3 not masked were etched by the reverse sputtering method or the ion-milling method. At this time, an abut junction structure was formed. After formation of electrode layers 100 on the etched end portions, the resist film was removed through the lift-off process so that the anisotropy magnetoresistance effect (AMR) type magnetoresistance effect type head was prepared as shown in FIG. 16. Although not shown in FIG. 16. an upper shield layer and a lower shield layer were formed via an $Al_2O_3$ gap film, and an inductive head portion was further formed on the upper shield layer.

EXAMPLE 10

A spin valve (SV) type magnetoresistance effect type head was prepared as shown in FIG. 6.

First, a spin valve type magnetoresistance effect element was prepared. Specifically, the element sample was prepared by stacking, on a substrate 5 (AlTiC with $Al_2O_3$), a ground layer 7 (Ta; 5 nm in thickness), a soft magnetic layer 20 (NiFe; 7 nm in thickness), a non-magnetic metal layer 30 (Cu; 2.5 nm in thickness), a ferromagnetic layer 40 (Co; 3 nm in thickness), a pinning layer (antiferromagnetic layer) 50 ($Ru_{10}Rh_{10}Mn_{80}$; 10 nm in thickness) and a protective layer 80 (Ta; 5 nm in thickness) in the order named. In this element sample, an upper shield layer and a lower shield layer were formed via an $Al_2O_3$ gap film.

Figure 17:
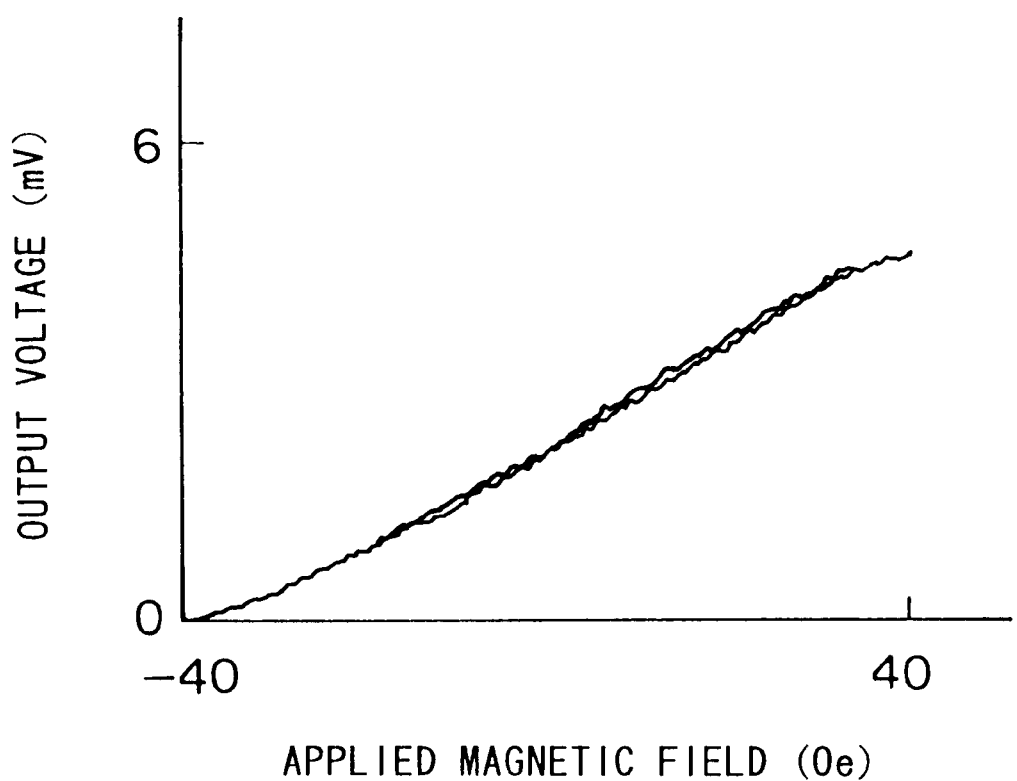
FIG. 17 is a graph showing a relationship between applied magnetic field and output voltage in a magnetoresistance device according to the present invention.

In this element sample, an inductive head portion as shown in FIG. 6 was formed. Specifically, NiFe was formed to have a thickness of 10 nm as linking soft magnetic layers 520, and then, $Ru_5Rh_{15}Mn_{20}$ was formed on the linking soft magnetic layers 520 to have a thickness of 10 nm as antiferromagnetic layers 800. Thereafter, electrode portions 100 made of Ta were further formed on the antiferromagnetic layers 800 so that the spin valve (SV) type magnetoresistance effect type head was prepared as shown in FIG. 6. Subsequently, in vacuum of $10^{-7}$ Torr, the head was cooled from 200° C. while applying a magnetic field of 2000 e in an in-plane direction perpendicular to a measurement current direction, so as to induce the pinning effect for the ferromagnetic layer. A track width of the magnetoresistance effect type head was set to 2 μm, while a height of the MR element was set to 1 μm and a sense current was set to 4 mA. A relationship between the applied magnetic field and the output voltage was examined using the magnetoresistance effect type head. The results are shown in FIG. 17. Although the graph of FIG. 17 was obtained using the head having no upper and lower shield layers, it was confirmed that the relationship had excellent linearity and formed a transfer curve with no Barkhausen noise at high output.

EXAMPLE 11

Figure 18:
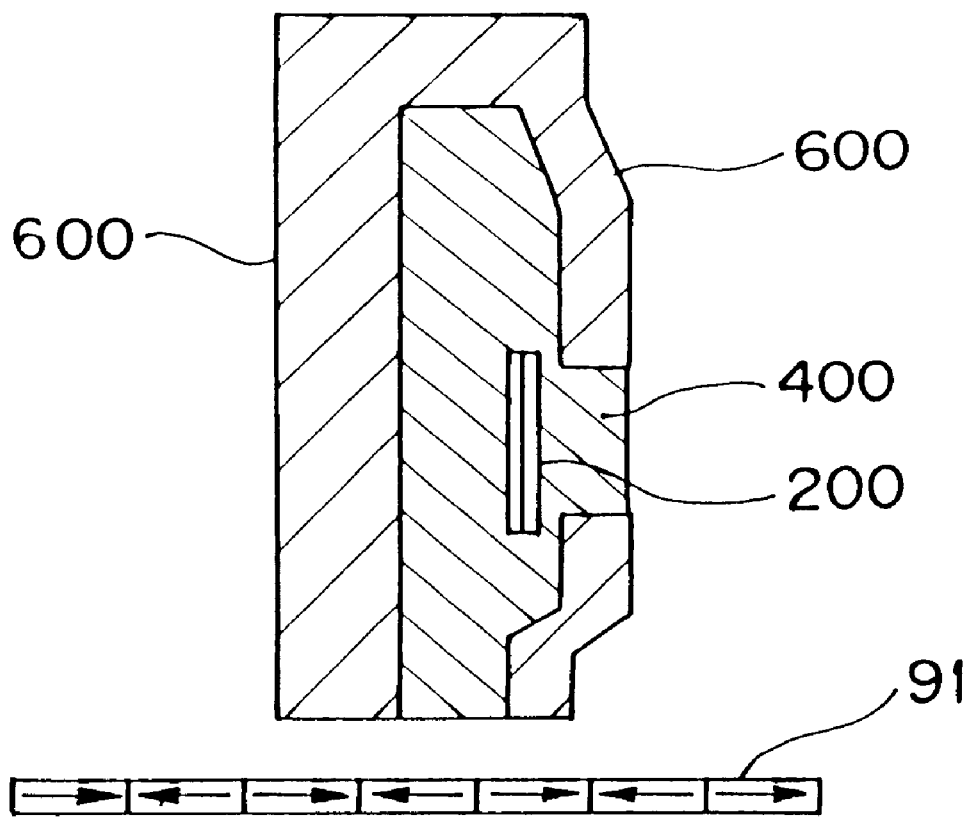
FIG. 18 is a partially omitted sectional view showing an example, wherein a magnetoresistance effect element (magnetic multilayered film) according to the present invention is applied to a yoke-type MR head.

FIG. 18 shows an example in which the magnetoresistance effect element of the present invention is applied to a yoke-type MR head. In this example, a cutout is formed at a portion of yokes 600, 600, and a magnetoresistance effect element 200 is formed therebetween via a thin insulation film 400. The magnetoresistance effect element 200 is provided with electrodes (not shown) for feeding a current in a direction parallel to or perpendicular to a magnetic path formed by the yokes 600, 600.

EXAMPLE 12

Figure 19:
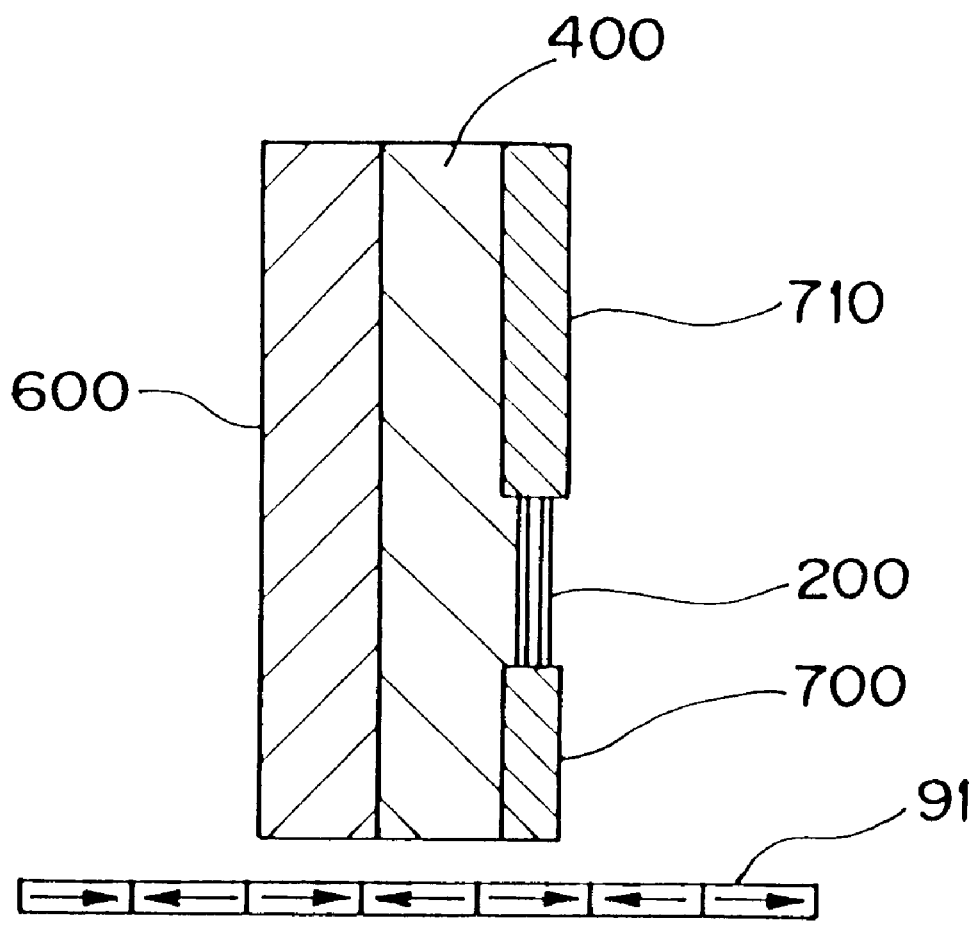
FIG. 19 is a partially omitted sectional view showing an example, wherein a magnetoresistance effect element (magnetic multilayered film) according to the present invention is applied to a flux guide type MR head.

FIG. 19 shows an example in which the magnetoresistance effect element of the present invention is applied to a flux guide type MR head. In this example, a magnetoresistance effect element 200 is magnetically coupled to flux guide layers 700 and 710 of high resistivity and high permeability. The flux guide layers 700 and 710 indirectly conduct a signal magnetic field to the magnetoresistance effect element 200. Further, via a non-magnetic insulation layer 400, a flux back guide layer 600 (escape path for magnetic flux passing the magnetoresistance effect element 200) is formed. Flux back guide layers 600 may be provided at both sides the magnetoresistance effect element 200 via the non-magnetic insulation layer 400. A feature of this head resides in that a magnetic field detecting portion thereof can approximate a recording medium in a nearly abutting fashion so that the high output can be obtained.

As appreciated from the foregoing results, according to the preferred embodiments of the present invention, since the pinning layer (antiferromagnetic layer) has a composition of Ru—Mn or Ru—M—Mn where M represents at least one selected from Rh, Pt, Pd, Au, Ag and Re, and the impurity concentrations of the pinning layer are regulated, there can be provided the magnetoresistance effect element having the magnetic multilayered film which is excellent in corrosion resistance, thermal stability and magnetic field sensitivity and has a large MR change ratio, as well as the magnetoresistance device, such as a magnetoresistance effect type head or the like, using such a magnetoresistance effect element.

What is claimed is:

1. A magnetoresistance device comprising a magnetoresistance effect element, conductive films and electrode portions, wherein said conductive films are conductively connected to said magnetoresistance effect element through said electrode portions, and said magnetoresistance effect element comprises a magnetic multilayered film including a non-magnetic metal layer, a ferromagnetic layer formed on one surface of the non-magnetic metal layer, a soft magnetic layer formed on the other surface of said non-magnetic metal layer, and a pinning layer which is formed on a surface of said ferromagnetic layer remote from a surface thereof abutting said non-magnetic metal layer so as to pin a direction of magnetization of said ferromagnetic layer, and wherein said pinning layer is made of $Ru_xM_yMn_z$ where M represents at least one selected from Rh, Pt, Pd, Au, Ag and Re, $1 \leq x \leq 30$, $1 \leq y \leq 30$, $69 \leq z \leq 90$, $10 \leq x+y \leq 31$, and the unit of x, y and z is atomic %.

2. The magnetoresistance device according to claim 1, wherein said pinning layer has an oxygen concentration of no more than 5,000 atomic ppm, a carbon concentration of no more than 5,000 atomic ppm, a sulfur concentration of no more than 5,000 atomic ppm, and a chlorine concentration of no more than 5,000 atomic ppm.

3. The magnetoresistance device according to claim 2, wherein said pinning layer is made of $Ru_xRh_yMn_z$ where $1 \leq x \leq 30$, $1 \leq y \leq 30$, $69 \leq z \leq 90$, $10 \leq x+y \leq 31$, and the unit of x, y and z is atomic %.

4. The magnetoresistance device according to claim 2, wherein said pinning layer is made of $Ru_xPt_yMn_z$ where $1 \leq x \leq 30$, $1 \leq y \leq 30$, $69 \leq z \leq 90$, $10 \leq x+y \leq 31$, and the unit of x, y and z is atomic %.

5. The magnetoresistance device according to claim 2, wherein said pinning layer is made of $Ru_xM_yMn_z$ where M represents at least one selected from Rh, Pt, Pd, Au, Ag and Re, $1 \leq x \leq 24$, $1 \leq y \leq 24$, $75 \leq z \leq 85$, $15 \leq x+y \leq 25$, and the unit of x, y and z is atomic %.

6. The magnetoresistance device according to claim 2, wherein a blocking temperature of said pinning layer is 160° C. or higher.

7. The magnetoresistance device according to claim 2, wherein an exchange coupling energy between said pinning layer and said ferromagnetic layer is 0.06 erg/cm² or greater.

8. The magnetoresistance device according to claim 2, wherein, in a relationship of temperature-exchange coupling energy between said pinning layer and said ferromagnetic layer, a temperature coefficient in the range of 80 to 130° C. is $-2 \times 10^{-4}$ to $-8 \times 10^{-4}$ erg/cm².

9. The magnetoresistance device according to claim 2, wherein said magnetic multilayered film is a spin valve film revealing a giant magnetoresistance effect.

10. The magnetoresistance device according to claim 9, wherein said soft magnetic layer comprises, from a side of said non-magnetic metal layer, a first soft magnetic layer and a second soft magnetic layer, wherein said first soft magnetic layer is made of Co or an alloy containing Co no less than 80 weight %, and said second soft magnetic layer is made of $(Ni_xFe_{1-x})_yCo_{1-y}$ where $0.7 \leq x \leq 0.9$, $0.5 \leq y \leq 0.8$, and the unit of x and y is weight %, and wherein said non-magnetic metal layer is made of a material including at least one selected from Au, Ag and Cu.

11. The magnetoresistance device according to claim 2, wherein said magnetic multilayered film reveals an anisotropy magnetoresistance effect.

12. The magnetoresistance device according to claim 11, wherein said soft magnetic layer is made of an NiFe alloy and at least one selected from Rh, Cr, Ta, Nb, Zr and Hf and works as a lateral bias layer, and wherein said non-magnetic metal layer is made of Ta, Ti, $Al_2O_3$ or $SiO_2$ and works as a non-magnetic separation layer.

13. A magnetoresistance device comprising a magnetoresistance effect element, conductive films and electrode portions, wherein said conductive films are conductively connected to said magnetoresistance effect element through said electrode portions, and said magnetoresistance effect element comprises a magnetic multilayered film including a non-magnetic metal layer, a ferromagnetic layer formed on one surface of the non-magnetic metal layer, a soft magnetic layer formed on the other surface of said non-magnetic metal layer, and a pinning layer which is formed on a surface of said ferromagnetic layer remote from a surface thereof abutting said non-magnetic metal layer so as to pin a direction of magnetization of said ferromagnetic layer, and wherein said pinning layer is made of $Ru_xM_yMn_z$ where M represents at least one selected from Rh, Pt, Pd, Au, Ag and Re, $1 \leq x \leq 59$, $1 \leq y \leq 59$, $40 \leq z \leq 58$, $42 \leq x+y \leq 60$, and the unit of x, y and z is atomic %.

14. The magnetoresistance device according to claim 13, wherein said pinning layer has an oxygen concentration of no more than 5,000 atomic ppm, a carbon concentration of no more than 5,000 atomic ppm, a sulfur concentration of no more than 5,000 atomic ppm, and a chlorine concentration of no more than 5,000 atomic ppm.

15. The magnetoresistance device according to claim 14, wherein said pinning layer is made of $Ru_xRh_yMn_z$ where $1 \leq x \leq 59$, $1 \leq y \leq 59$, $40 \leq z \leq 58$, $42 \leq x+y \leq 60$, and the unit of x, y and z is atomic %.

16. The magnetoresistance device according to claim 14, wherein said pinning layer is made of $Ru_xPt_yMn_z$ where $1 \leq x \leq 59$, $1 \leq y \leq 59$, $40 \leq z \leq 58$, $42 \leq x+y \leq 60$, and the unit of x, y and z is atomic %.

17. The magnetoresistance device according to claim 14, wherein said pinning layer is made of $Ru_xM_yMn_z$ where M represents at least one selected from Rh, Pt, Pd, Au, Ag and Re, $1 \leq x \leq 54$, $1 \leq y \leq 54$, $45 \leq z \leq 54$, $46 \leq x+y \leq 55$, and the unit of x, y and z is atomic %.

18. The magnetoresistance device according to claim 14, wherein a blocking temperature of said pinning layer is 160° C. or higher.

19. The magnetoresistance device according to claim 14, wherein an exchange coupling energy between said pinning layer and said ferromagnetic layer is 0.06 erg/cm² or greater.

20. The magnetoresistance device according to claim 14, wherein, in a relationship of temperature-exchange coupling energy between said pinning layer and said ferromagnetic layer, a temperature coefficient in the range of 80 to 130° C. is $-2 \times 10^{-4}$ to $-8 \times 10^{-4}$ erg/cm².

21. The magnetoresistance device according to claim 14, wherein said magnetic multilayered film is a spin valve film revealing a giant magnetoresistance effect.

22. The magnetoresistance device according to claim 21, wherein said soft magnetic layer comprises, from a side of said non-magnetic metal layer, a first soft magnetic layer and a second soft magnetic layer, wherein said first soft magnetic layer is made of Co or an alloy containing Co no less than 80 weight %, and said second soft magnetic layer is made of $(Ni_xFe_{1-x})_yCo_{1-y}$ where $0.7 \leq x \leq 0.9$, $0.5 \leq y \leq 0.8$, and the unit of x and y is weight %, and wherein said non-magnetic metal layer is made of a material including at least one selected from Au, Ag and Cu.

23. The magnetoresistance device according to claim 14, wherein said magnetic multilayered film reveals an anisotropy magnetoresistance effect.

24. The magnetoresistance device according to claim 23, wherein said soft magnetic layer is made of an NiFe alloy and at least one selected from Rh, Cr, Ta, Nb, Zr and Hf and works as a lateral bias layer, and wherein said non-magnetic metal layer is made of Ta, Ti, $Al_2O_3$ or $SiO_2$ and works as a non-magnetic separation layer.

25. A magnetoresistance device comprising a magnetoresistance effect element, conductive films and electrode portions, wherein said conductive films are conductively connected to said magnetoresistance effect element through said electrode portions, and said magnetoresistance effect element comprises a magnetic multilayered film including a non-magnetic metal layer, a ferromagnetic layer formed on one surface of the non-magnetic metal layer, a soft magnetic layer formed on the other surface of said non-magnetic metal layer, and a pinning layer which is formed on a surface of said ferromagnetic layer remote from a surface thereof abutting said non-magnetic metal layer so as to pin a direction of magnetization of said ferromagnetic layer, and wherein said pinning layer is made of $Ru_xMn_{100-x}$ where $15 \leq x \leq 30$, and the unit of x is atomic %.

26. The magnetoresistance device according to claim 25, wherein said pinning layer has an oxygen concentration of no more than 5,000 atomic ppm, a carbon concentration of no more than 5,000 atomic ppm, a sulfur concentration of no more than 5,000 atomic ppm, and a chlorine concentration of no more than 5,000 atomic ppm.

27. The magnetoresistance device according to claim 26, wherein said pinning layer is made of $Ru_xMn_{100-x}$ where $18 \leq x \leq 27$, and the unit of x is atomic %.

28. The magnetoresistance device according to claim 26, wherein a blocking temperature of said pinning layer is 160° C. or higher.

29. The magnetoresistance device according to claim 26, wherein an exchange coupling energy between said pinning layer and said ferromagnetic layer is 0.06 erg/cm² or greater.

30. The magnetoresistance device according to claim 26. wherein, in a relationship of temperature-exchange coupling energy between said pinning layer and said ferromagnetic layer, a temperature coefficient in the range of 80 to 130° C. is $-2 \times 10^{-4}$ to $-8 \times 10^{-4}$ erg/cm².

31. The magnetoresistance device according to claim 26, wherein said magnetic multilayered film is a spin valve film revealing a giant magnetoresistance effect.

32. The magnetoresistance device according to claim 31, wherein said soft magnetic layer comprises, from a side of said non-magnetic metal layer, a first soft magnetic layer and a second soft magnetic layer, wherein said first soft magnetic layer is made of Co or an alloy containing Co no less than 80 weight %, and said second soft magnetic layer is made of $(Ni_xFe_{1-x})_yCo_{1-y}$ where $0.7 \leq x \leq 0.9$, $0.5 \leq y \leq 0.8$, and the unit of x and y is weight %, and wherein said non-magnetic metal layer is made of a material including at least one selected from Au, Ag and Cu.

33. The magnetoresistance device according to claim 26, wherein said magnetic multilayered film reveals an anisotropy magnetoresistance effect.

34. The magnetoresistance device according to claim 33, wherein said soft magnetic layer is made of an NiFe alloy and at least one selected from Rh, Cr, Ta, Nb, Zr and Hf and works as a lateral bias layer, and wherein said non-magnetic metal layer is made of Ta, Ti, $Al_2O_3$ or $SiO_2$ and works as a non-magnetic separation layer.

35. A magnetoresistance effect element comprising a magnetic multilayered film including a non-magnetic metal layer, a ferromagnetic layer formed on one surface of the non-magnetic metal layer, a soft magnetic layer formed on the other surface of said non-magnetic metal layer, and a pinning layer which is formed on a surface of said ferromagnetic layer remote from a surface thereof abutting said non-magnetic metal layer so as to pin a direction of magnetization of said ferromagnetic layer, wherein said pinning layer is made of $Ru_xM_yMn_z$ where M represents at least one selected from Rh, Pt, Pd, Au, Ag and Re, $1 \leq x \leq 30$, $1 \leq y \leq 30$, $69 \leq z \leq 90$, $10 \leq x+y \leq 31$, and the unit of x, y and z is atomic %.

36. The magnetoresistance effect element according to claim 35, wherein said pinning layer has an oxygen concentration of no more than 5,000 atomic ppm, a carbon concentration of no more than 5,000 atomic ppm, a sulfur concentration of no more than 5,000 atomic ppm, and a chlorine concentration of no more than 5,000 atomic ppm.

37. The magnetoresistance effect element according to claim 36, wherein said pinning layer is made of $Ru_xRh_yMn_z$ where $1 \leq x \leq 30$, $1 \leq y \leq 30$, $69 \leq z \leq 90$, $10 \leq x+y \leq 31$, and the unit of x, y and z is atomic %.

38. The magnetoresistance effect element according to claim 36, wherein said pinning layer is made of $Ru_xPt_yMn_z$ where $1 \leq x \leq 30$, $1 \leq y \leq 30$, $69 \leq z \leq 90$, $10 \leq x+y \leq 31$, and the unit of x, y and z is atomic %.

39. A magnetoresistance effect element comprising a magnetic multilayered film including a non-magnetic metal layer, a ferromagnetic layer formed on one surface of the non-magnetic metal layer, a soft magnetic layer formed on the other surface of said non-magnetic metal layer, and a pinning layer which is formed on a surface of said ferromagnetic layer remote from a surface thereof abutting said non-magnetic metal layer so as to pin a direction of magnetization of said ferromagnetic layer, wherein said pinning layer is made of $Ru_xM_yM_z$ where M represents at least one selected from Rh, Pt, Pd, Au, Ag and Re, $1 \leq x \leq 59$, $1 \leq y \leq 59$, $40 \leq z \leq 58$, $42 \leq x+y \leq 60$, and the unit of x, y and z is atomic %.

40. The magnetoresistance effect element according to claim 39, wherein said pinning layer has an oxygen concentration of no more than 5,000 atomic ppm, a carbon concentration of no more than 5,000 atomic ppm, a sulfur concentration of no more than 5,000 atomic ppm, and a chlorine concentration of no more than 5,000 atomic ppm.

41. The magnetoresistance effect element according to claim 40, wherein said pinning layer is made of $Ru_xRh_yMn_z$ where $1 \leq x \leq 59$, $1 \leq y \leq 59$, $40 \leq z \leq 58$, $42 \leq x+y \leq 60$, and the unit of x, y and z is atomic %.

42. The magnetoresistance effect element according to claim 40, wherein said pinning layer is made of $Ru_xPt_yMn_z$ where $1 \leq x \leq 59$, $1 \leq y \leq 59$, $40 \leq z \leq 58$, $42 \leq x+y \leq 60$, and the unit of x, y and z is atomic %.

43. The magnetoresistance effect element according to claim 40, wherein said pinning layer is made of $Ru_xM_yMn_z$ where M represents at least one selected from Rh, Pt, Pd, Au, Ag and Re, $1 \leq x \leq 54$, $1 \leq y \leq 54$, $45 \leq z \leq 54$, $46 \leq x+y \leq 55$, and the unit of x, y and z is atomic %.

44. A magnetoresistance effect element comprising a magnetic multilayered film including a non-magnetic metal layer, a ferromagnetic layer formed on one surface of the non-magnetic metal layer, a soft magnetic layer formed on the other surface of said non-magnetic metal layer, and a pinning layer which is for med on a surface of said ferromagnetic layer remote from a surface thereof abutting said non-magnetic metal layer so as to pin a direction of magnetization of said ferromagnetic layer, wherein said pinning layer is made of $Ru_xMn_{100-x}$ where $15 \leq x \leq 30$, and the unit of x is atomic %.

45. The magnetoresistance effect element according to claim 44, wherein said pinning layer has an oxygen concentration of no more than 5,000 atomic ppm, a carbon concentration of no more than 5,000 atomic ppm, a sulfur concentration of no more than 5,000 atomic ppm, and a chlorine concentration of no more than 5,000 atomic ppm.

46. The magnetoresistance effect element according to claim 45, wherein said pinning layer is made of $Ru_xMn_{100-x}$ where $18 \leq x \leq 27$, and the unit of x is atomic %.

* * * * *